(12) United States Patent
Hashimoto et al.

(10) Patent No.: US 11,165,006 B2
(45) Date of Patent: Nov. 2, 2021

(54) LIGHT EMITTING DEVICE INCLUDING EXTERNAL CONNECTION ELECTRODES, AND METHOD THEREOF

(71) Applicant: NICHIA CORPORATION, Anan (JP)

(72) Inventors: Toru Hashimoto, Tokushima (JP); Yoichi Bando, Anan (JP); Tadaaki Ikeda, Anan (JP); Gensui Tamura, Anan (JP)

(73) Assignee: NICHIA CORPORATION, Anan (JP)

( * ) Notice: Subject to any disclaimer, the term of this patent is extended or adjusted under 35 U.S.C. 154(b) by 112 days.

(21) Appl. No.: 16/582,197

(22) Filed: Sep. 25, 2019

(65) Prior Publication Data
US 2020/0098964 A1 Mar. 26, 2020

(30) Foreign Application Priority Data

Sep. 26, 2018 (JP) .............................. JP2018-180882
Nov. 6, 2018 (JP) .............................. JP2018-208665
Dec. 5, 2018 (JP) .............................. JP2018-228563
Apr. 26, 2019 (JP) .............................. JP2019-085159

(51) Int. Cl.
*H01L 33/62* (2010.01)
*H01L 33/40* (2010.01)
*H01L 25/075* (2006.01)

(52) U.S. Cl.
CPC .......... *H01L 33/62* (2013.01); *H01L 25/0753* (2013.01); *H01L 33/405* (2013.01); *H01L 2933/0066* (2013.01)

(58) Field of Classification Search
USPC .......................................................... 257/79
See application file for complete search history.

(56) References Cited

U.S. PATENT DOCUMENTS

2004/0012964 A1* 1/2004 Makuta ................ H05K 1/0209
362/294
2010/0059782 A1 3/2010 Fujitomo et al.
2014/0021627 A1 1/2014 Kimura et al.
(Continued)

FOREIGN PATENT DOCUMENTS

JP 2004207542 A 7/2004
JP 2010239105 A 10/2010
(Continued)

*Primary Examiner* — Nduka E Ojeh
(74) *Attorney, Agent, or Firm* — Hunton Andrews Kurth LLP

(57) ABSTRACT

The method of manufacturing a light emitting device includes: providing a first intermediate body, the first intermediate body including a temporary substrate including a base and a pair of first wirings, and a light emitting element including a pair of element electrodes, each of the pair of element electrodes connected to a respective one of the first wirings via a respective one of a plurality of solders; removing a portion of the temporary substrate to form a second intermediate body having a second lower surface in which a lower surface of each of the element electrodes and a lower surface of each of the plurality of solders are located; and forming a pair of external connection electrodes on the second lower surface such that each of the pair of external connection electrodes cover a respective one of the element electrodes and a respective one of the plurality of solders.

21 Claims, 29 Drawing Sheets

(56) References Cited

U.S. PATENT DOCUMENTS

| | | | |
|---|---|---|---|
| 2015/0340578 A1* | 11/2015 | Tamaki | H01L 24/97 |
| | | | 257/99 |
| 2016/0351768 A1* | 12/2016 | Matsuda | H01L 24/03 |
| 2017/0018686 A1* | 1/2017 | Hashimoto | H01L 33/54 |
| 2018/0261734 A1 | 9/2018 | Herrmann et al. | |

FOREIGN PATENT DOCUMENTS

| | | | |
|---|---|---|---|
| JP | 2017022305 A | 1/2017 |
| JP | 2018514950 A | 6/2018 |
| JP | 2018107258 A | 7/2018 |
| WO | 2012137714 A1 | 10/2012 |

\* cited by examiner

LIGHT EMITTING DEVICE INCLUDING EXTERNAL CONNECTION ELECTRODES, AND METHOD THEREOF

CROSS-REFERENCE TO RELATED APPLICATIONS

This application claims priority to Japanese Patent Application No. 2018-180882, filed on Sep. 26, 2018, Japanese Patent Application No. 2018-208665, filed on Nov. 6, 2018, Japanese Patent Application No. 2018-228563, filed on Dec. 5, 2018, and Japanese Patent Application No. 2019-085159, filed on Apr. 26, 2019, the contents of which are hereby incorporated by reference in their entireties.

BACKGROUND

1. Technical Field

The present disclosure relates to a method of manufacturing a light emitting device, and a light emitting device.

2. Description of Related Art

Light emitting elements (LED elements) are widely used for various products such as light sources for backlights, and various kinds of illumination devices. JP 2004-207542 A describes a small light emitting device including a light emitting element housing package defining a recess; and a light emitting element housed and mounted in the recess.

SUMMARY

Reduction in thickness of light emitting devices is required in order to reduce size of products in which light emitting devices are installed. One object of certain embodiments of the present disclosure is to provide a method of manufacturing a thin light emitting device, and to provide a thin light emitting device.

The method of manufacturing a light emitting device according to certain embodiments of the present disclosure includes: providing a first intermediate body, the first intermediate body including a temporary substrate including a base having an upper surface and a first lower surface opposite to the upper surface, and a pair of first wirings disposed on the upper surface of the base, and a light emitting element disposed on the first wirings and including an electrode-formation surface and a pair of element electrodes formed on the electrode-formation surface, each of the pair of element electrodes connected to a respective one of the first wirings via a respective one of a plurality of solders; removing a portion of the temporary substrate at a first lower surface side of the base to form a second intermediate body having a second lower surface in which a lower surface of each of the element electrodes and a lower surface of each of the plurality of solders are located; and forming a pair of external connection electrodes on the second lower surface such that each of the pair of external connection electrodes cover a respective one of the pair of element electrodes and a respective one of the plurality of solders.

The light emitting device according to certain embodiments of the present disclosure includes: a light emitting element including a semiconductor layered body having a light extraction surface and an electrode-formation surface opposite to the light extraction surface, and a pair of element electrodes positioned on the electrode-formation surface; a plurality of solders each covering lateral surfaces of a respective one of the pair of element electrodes; a first reflecting member covering the electrode-formation surface of the semiconductor layered body and lateral surfaces of the solders; and external connection electrodes each in contact with a respective one of the pair of element electrodes, the first reflecting member, and a respective one of the plurality of solders.

The method of manufacturing a light emitting device according to an embodiment of the present disclosure allows for obtaining a thin light emitting device. Further, the light emitting device according to an embodiment of the present disclosure can have a reduced thickness.

Figure 1A:
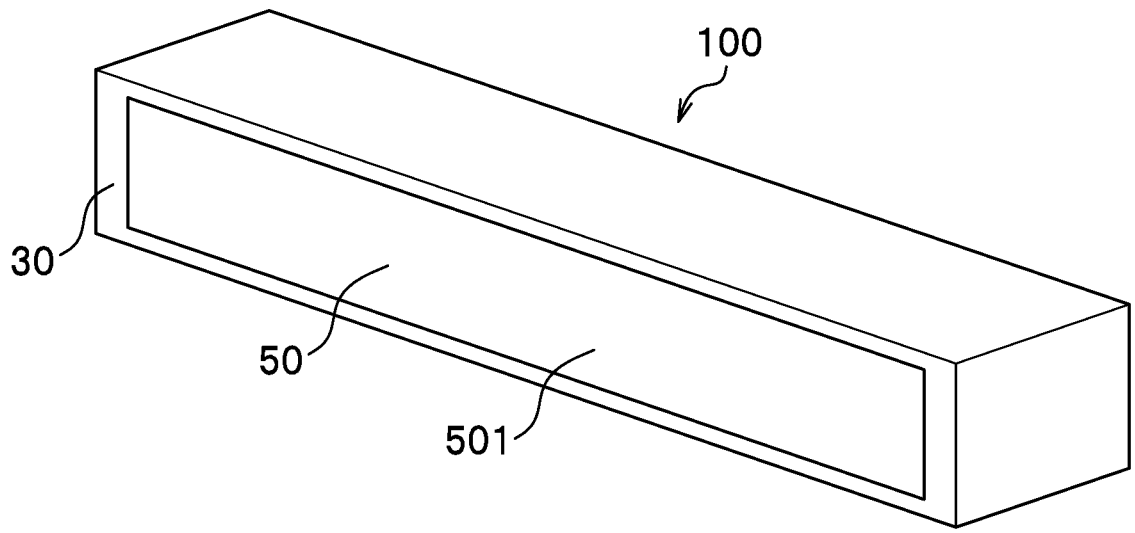
FIG. 1A is a perspective view schematically showing the entirety of a light emitting device according to a first embodiment of the present disclosure when viewed from a light-transmissive member side.

Hereinafter, certain embodiments of the present disclosure will be described with reference to the drawings as appropriate. The light emitting devices described below are intended to give a concrete form the technical ideas of the present invention, and the scope of the present invention is not limited to the embodiments described below unless otherwise specified. Further, descriptions in one embodiment are applicable to other embodiments and modified examples. Further, the sizes and positional relationships of the members shown in the drawings may be exaggerated for clarification of description. In the present disclosure, the configuration of a light emitting device will be described, followed by describing a method of manufacturing a light emitting device.

First Embodiment

Figure 1B:
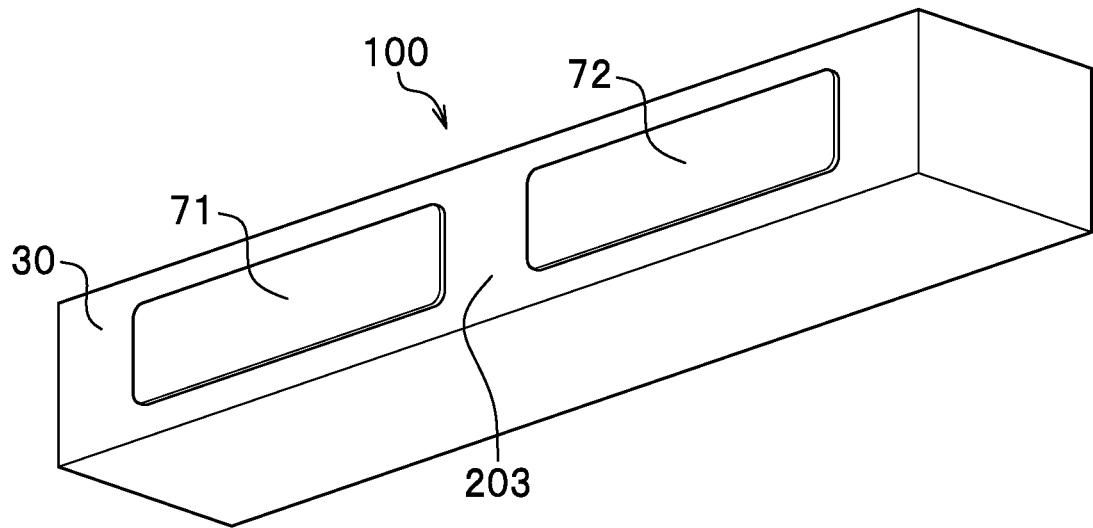
FIG. 1B is a perspective view schematically showing the entirety of the light emitting device according to the first embodiment of the present disclosure when viewed from an external connection electrodes side.
Figure 2A:
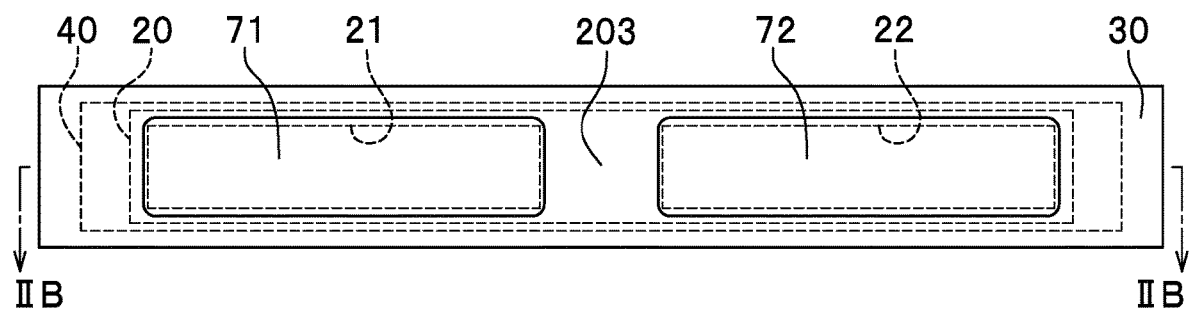
FIG. 2A is a bottom view schematically showing the light emitting device according to the first embodiment of the present disclosure when viewed from above an external connection electrode.
Figure 2B:
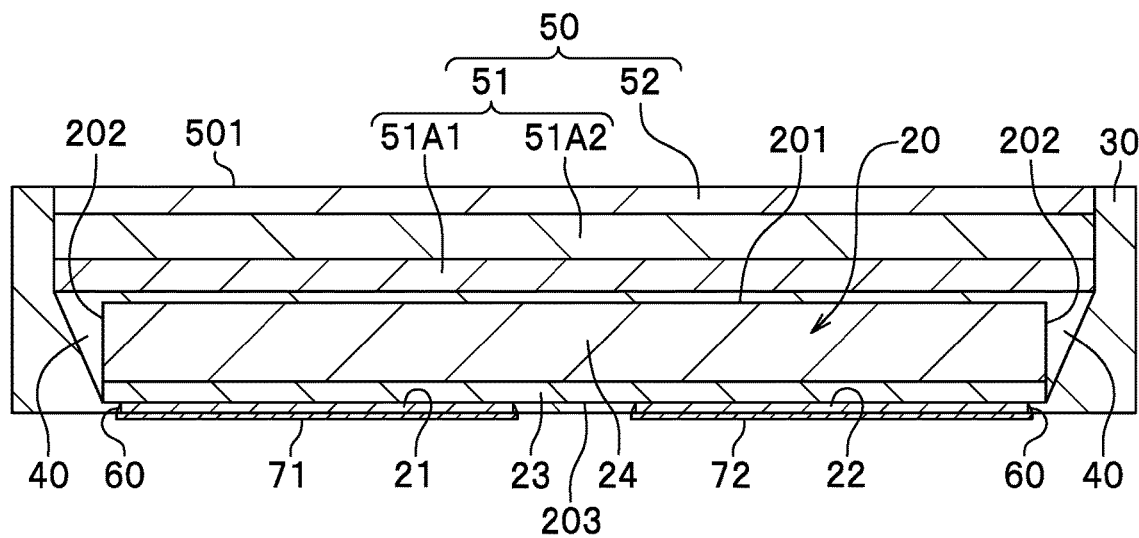
FIG. 2B is a cross-sectional view schematically showing a cross-section taken along line IIB-IIB in FIG. 2A.

A light emitting device according to a first embodiment of the present disclosure will be described with reference to FIG. 1A to FIG. 2B. FIG. 1A is a perspective view schematically showing entirety of the light emitting device according to the first embodiment when viewed from a light-transmissive member side. FIG. 1B is a perspective view schematically showing the entirety of the light emitting device according to the first embodiment when viewed from the external connection electrodes side. FIG. 2A is a bottom view showing the light emitting device according to the first embodiment when viewed from above the external connection electrodes. FIG. 2B is a schematic cross-sectional view taken along line IIB-IIB in FIG. 2A.

A light emitting device 100 may include a light emitting element 20; a plurality of solders 60 covering lateral surfaces of element electrodes 21 and 22 of the light emitting element 20; a first reflecting member 30 covering an electrode-formation surface 203 of the light emitting element 20 and lateral surfaces of the plurality of solders 60; and external connection electrodes 71 and 72, each of which is in contact with a respective one of the element electrodes 21 and 22, the first reflecting member 30, and a respective one of the plurality of solders 60.

Components of the light emitting device 100 will be described below.

Light Emitting Element

The light emitting element 20 is a semiconductor element configured to emit light when a voltage is applied. For the light emitting element 20, a known semiconductor element using a nitride semiconductor or the like can be used.

The light emitting element 20 includes an element substrate 24, a semiconductor layered body 23 layered on the element substrate 24, and a pair of element electrodes 21 and 22 provided on the semiconductor layered body 23. In the light emitting element 20, in one example, an upper surface of the element substrate 24 serves as a light extraction surface 201, and a lower surface of the semiconductor layered body 23 at a side opposite to the light extraction surface 201 serves as an electrode-formation surface 203.

Examples of the light emitting element 20 include LED chips. The light emitting element 20 includes a semiconductor layered body 23, and optionally further includes the element substrate 24 in many cases. Further, the light emitting element 20 includes the element electrodes 21 and 22, and the element electrodes 21 and 22 may be made of gold, silver, copper, tin, platinum, rhodium, titanium, aluminum, tungsten, palladium, nickel or an alloy thereof. It is preferable to use a nitride semiconductor for a semiconductor material of the semiconductor layered body 23. The nitride semiconductor is generally represented by $In_xAl_yGa_{1-x-y}N$ (0≤x, 0≤y, x+y≤1).

Alternatively, an InAlGaAs-based semiconductor, an InAlGaP-based semiconductor, zinc sulfide, zinc selenide, silicon carbide or the like can be used for the semiconductor material. The element substrate 24 of the light emitting element 20 is generally a substrate for crystal growth, on which crystals of a semiconductor that forms the semiconductor layered body 23 can be grown. The element substrate 24 may be a bonding substrate that is bonded to a semiconductor element structure from which the crystal growing substrate has been separated.

When the element substrate 24 is transmissive, flip-chip-mounting is easily employed, and light extraction efficiency is easily increased. Examples of the base material of the element substrate 24 include sapphire, gallium nitride, aluminum nitride, silicon, silicon carbide, gallium arsenide, gallium phosphide, indium phosphide, zinc sulfide, zinc oxide, zinc selenide and diamond. Among them, sapphire is preferable. The element substrate 24 may have any appropriate thickness, and a thickness of the element substrate 24 is, for example, 0.02 mm or more and 1 mm or less, preferably 0.05 mm or more and 0.3 mm or less in view of the strength of the element substrate 24 and/or the thickness of the light emitting device 100.

The light emitting element 20 preferably has a pair of positive and negative element electrodes 21 and 22 on the same surface side. This allows for performing flip-chip-mounting of the light emitting element 20. The light emitting element 20 has the light extraction surface 201 at a side opposite to the electrode-formation surface 203, on which the element electrodes 21 and 22 are disposed. The light emitting element 20 includes the element substrate 24, but may not include the element substrate 24 when the light emitting device 100 is obtained. In one example, a light-transmissive member 50 is disposed on the light extraction surface 201 of the light emitting element 20, and the light-transmissive member 50 is disposed to be exposed from the first reflecting member 30. The element electrode has an upper surface facing the electrode-formation surface of the light emitting element 20. Each of the element electrodes 21 and 22 has a lower surface at a side opposite to the upper surface of a respective one of the element electrodes 21 and 22, and the lower surface of each of the element electrodes 21 and 22 face a respective one of first wirings 12 and 13 of a temporary substrate 10. The lateral surfaces of each of the element electrodes 21 and 22 are surfaces positioned between the upper surface of each of the element electrodes 21 and 22 and the lower surface of each of the element electrodes 21 and 22.

Solder

Each solder 60 may be formed to cover the lateral surfaces of a respective one of the element electrodes 21 and 22 of the light emitting element 20. Each solder 60 is electrically connected to a respective one of the external connection electrodes 71 and 72 together with a respective one of the element electrodes 21 and 22 of the light emitting element 20. Examples of a material of the solders 60 include a known material such as a tin-bismuth-based material, a tin-copper-based material, a tin-silver-based material and a gold-tin-based material.

Further, each solder 60 is disposed on the lateral surfaces of a respective one of the element electrodes 21 and 22 such that the area of the lower surface of each solder 60 increases toward the external connection electrodes 71 and 72 from the electrode-formation surface 203. It is desirable that each solder 60 be formed so as to cover 50% or more of the lateral surfaces of a respective one of the element electrodes 21 and 22, or the entire lateral surfaces of the respective one of the element electrodes 21 and 22. With each solder 60 disposed on the lateral surfaces of a respective one of the element electrodes 21 and 22, entry of mounting materials of the external connection electrodes 71 and 72 and the like from gaps between the first reflecting member 30 and each of the element electrodes 21 and 22 and can be prevented, which allows for reducing degradation of the semiconductor layered body 23. Further, it is desirable that each solder be formed to surround a respective one of the element electrodes in top view. The "top view" as used herein refers to a view viewed in a direction substantially perpendicular to the upper surface of the base.

Further, at a region between the element electrodes 21 and 22 and the first reflecting member 30, the lateral surfaces of each solder 60 are inclined toward the first reflecting member 30 from the electrode-formation surface 203 to a respective one of the external connection electrodes 71 and 72 such that the lower surface of each solder has a greater area. Thus, as compared to a case where the solder 60 is not formed, the lower surface of each of the element electrodes 21 and 22 and the lower surface of a respective one of the solders 60 can be combined to increase the heat dissipation area, which allows for increasing heat dissipation performance. The "lower surface of the solder 60" refers to a surface of each solder 60 facing a respective one of the external connection electrodes 71 and 72. The "lateral surface of the solder" refers to an inclined surface of each solder 60 extending from the lower surface of the solder 60 to the electrode-formation surface side. When each solder 60 has an upper surface facing the electrode-formation surface, the lateral surface of the solder 60 is a surface positioned between the upper surface of the solder and the lower surface of the solder.

The solder 60 is used when the element electrodes 21 and 22 are connected to the first wirings 12 and 13 (see FIG. 5A) of the temporary substrate 10, which will have been removed when the light emitting device 100 is obtained. Thus, in the obtained light emitting device 100, the temporary substrate 10 is not present, and each solder 60 is disposed on the lateral surfaces (lateral peripheral surfaces) of a respective one of the element electrodes 21 and 22.

It is preferable that the lower surface of each solder 60, the lower surfaces of a respective one of a pair of element electrodes 21 and 22, and the lower surface of the first reflecting member 30, which is described below, are in the same plane. With these lower surfaces in the same plane, the external connection electrodes 71 and 72 described below can be easily formed.

Light-Transmissive Member

The light-transmissive member 50 is a light-transmissive member covering the light extraction surface 201 of the light emitting element 20 and protecting the light emitting element 20. The light-transmissive member 50 has an area larger than that of the light extraction surface 201 of the light emitting element 20 in top view. The lower surface of the light-transmissive member 50 may be connected to the light extraction surface 201 of the light emitting element 20 through the first light guiding member 40. The first light guiding member 40 may be positioned only between the light extraction surface 201 of the light emitting element 20 and the light-transmissive member 50 to secure the light emitting element 20 and the light-transmissive member 50 to each other, or may cover a region extending from the light extraction surface 201 of the light emitting element 20 to an element lateral surface 202 of the light emitting element 20 secure the light emitting element 20 and the light-transmissive member 50 to each other.

As a material for the light-transmissive member 50, for example, a resin can be used. Examples of the resin that can be used for the light-transmissive member 50 include silicone resins, epoxy resins, phenol resins, polycarbonate resins, acrylic resins and modified resins thereof. Using a silicon resin allows for increasing strength of the light emitting device 100, and accordingly it is preferable to use an epoxy resin as a material for the light-transmissive member 50. Further, silicone resins and modified silicone resins are preferable because silicone resins and modified silicone resins have a high heat resistance and light resistance. The light-transmissive member 50 may contain wavelength conversion particles and/or dispersion particles. Known wavelength conversion particles and/or dispersion particles can be used.

The light-transmissive member 50 may include a light transmitting layer 52 which does not contain wavelength conversion particles, and a wavelength conversion layer 51 which contains wavelength conversion particles. Further, the wavelength conversion layer 51 may include a first wavelength conversion layer 51A1 and a second wavelength conversion layer 51A2. With the light-transmissive member 50 having such a configuration, emission color of the light emitting device 100 can be easily adjusted.

The wavelength conversion particles are adapted to absorb at least a part of primary light emitted from the light emitting element 20, and to emit secondary light having a wavelength different from that of the primary light. When the light-transmissive member 50 contains wavelength conversion particles, it is possible to emit mixed light in which primary light emitted from the light emitting element 20 is mixed with secondary light emitted from the wavelength conversion particles. For example, when a blue LED is used for the light emitting element 20, and a fluorescent material such as YAG is used for the wavelength conversion particles, it is possible to obtain the light emitting device 100 configured to emit white light obtained by mixing blue light from the blue LED with yellow light emitted by the fluorescent material excited by the blue light. Further, the light emitting device 100 may be configured to emit white light using a blue LED for the light emitting element 20 and a β-sialon-based fluorescent material and a manganese-activated fluoride-based fluorescent material for wavelength conversion particles, the β-sialon-based fluorescent being a green fluorescent material, the manganese-activated fluoride-based fluorescent material being a red fluorescent material.

When the light-transmissive member 50 includes the wavelength conversion layer 51 and the light transmitting layer 52, the light transmitting layer 52 is positioned above the wavelength conversion layer 51 in a direction toward a light extraction surface 501. This structure allows the light transmitting layer 52 to function as a protective layer, and therefore degradation of wavelength conversion particles can be reduced. Further, with the light transmitting layer 52 positioned on the wavelength conversion layer 51, it is possible to use wavelength conversion particles which are easily affected by moisture. For example, manganese-activated fluoride-based fluorescent material may also be used for the wavelength conversion particles. The manganese-activated fluoride-based fluorescent material ensures emission of light having a relatively small spectral line width, and is a preferred member in view of color reproductivity.

Further, when the wavelength conversion layer 51 includes the first wavelength conversion layer 51A1, and the second wavelength conversion layer 51A2 covering the first wavelength conversion layer 51A1, the second wavelength conversion layer 51A2 may directly cover the first wavelength conversion layer 51A1, or cover the first wavelength conversion layer 51A1 such that another light-transmissive layer is disposed between the second wavelength conversion layer 51A2 and the first wavelength conversion layer 51A1. The peak emission wavelength of the wavelength conversion particles contained in the first wavelength conversion layer 51A1 is preferably shorter than the peak emission wavelength of the wavelength conversion particles contained in the second wavelength conversion layer 51A2. This allows the wavelength conversion particles in the second wavelength conversion layer 51A2 to be excited by light emitted from the first wavelength conversion layer 51A1 excited by the light emitting element 20. Accordingly, the amount of light from the wavelength conversion particles in the second wavelength conversion layer 51A2 can be increased.

The peak emission wavelength of the wavelength conversion particles contained in the first wavelength conversion layer 51A1 is preferably 500 nm or more and 570 nm or less, and the peak emission wavelength of the wavelength conversion particles contained in the second wavelength conversion layer 51A2 is preferably 610 nm or more and 750 nm or less. This allows for obtaining a light emitting device having high color reproductivity. Examples of the wavelength conversion particles contained in the first wavelength conversion layer 51A1 include those of β-sialon-based fluorescents, and examples of the wavelength conversion particles contained in the second wavelength conversion layer 51A2 include those of manganese-activated fluoride potassium silicate fluorescent materials. When a manganese-activated fluoride potassium silicate fluorescent material is used as wavelength conversion particles contained in the second wavelength conversion layer 51A2, in particular, it is preferable that the light-transmissive member 50 includes the first wavelength conversion layer 51A1 and the second wavelength conversion layer 51A2. A manganese-activated fluoride potassium silicate fluorescent material easily causes luminance saturation, but when the first wavelength conversion layer 51A1 is positioned between the second wavelength conversion layer 51A2 and the light emitting element 20, the manganese-activated fluoride potassium silicate fluorescent material can be prevented from being excessively irradiated with light from the light emitting element 20. Accordingly, degradation of the manganese-activated fluoride potassium silicate fluorescent material can be reduced.

First Light Guiding Member

The first light guiding member 40 is a member which fixes the light emitting element 20 and the light-transmissive member 50 to each other, and guides light from the light emitting element 20 to the light-transmissive member 50. Examples of the base material for the first light guiding member 40 silicone resins, epoxy resins, phenol resins, polycarbonate resins, acrylic resins and modified resins thereof. Using an epoxy resin for a material of the first light guiding member 40 allows for increasing hardness of the light emitting device 100 as compared to a case where a silicone resin is used, and thus an epoxy resin is preferably used for a material of the first light guiding member 40. Further, silicone resins and modified silicone resins have good heat resistance and light resistance, and thus are preferable. The first light guiding member 40 may contain the same wavelength conversion particles and/or dispersion particles as those in the wavelength conversion layer 51 of the light-transmissive member 50.

The first light guiding member 40 may be positioned only between the light extraction surface 201 of the light emitting element 20 and the light-transmissive member 50 to secure the light emitting element 20 and the light-transmissive member 50 to each other, or may cover a region extending from the light extraction surface 201 of the light emitting element 20 to the element lateral surface 202 of the light emitting element 20 to secure the light emitting element 20 and the light-transmissive member 50 to each other. When the first light guiding member 40 is positioned only between the light-transmissive member 50 and the light extraction surface 201, the lateral surfaces of the light emitting element 20 is covered with the first reflecting member 30. The first light guiding member 40 has a higher transmittance to light from the light emitting element 20 than that of the first reflecting member 30. Accordingly, when the first light guiding member 40 covers a region extending to the lateral surfaces of the light emitting element 20, light emitted from the element lateral surfaces 202 of the light emitting element 20 is easily extracted to outside the light emitting device 100 through the first light guiding member 40, so that light extraction efficiency can be enhanced.

First Reflecting Member

The first reflecting member 30 is a member which reflects light to the light extraction surface 501 side of the light-transmissive member 50, so that light from the light emitting element 20 is inhibited from being absorbed into a mounting substrate on which the light emitting device 100 is mounted. The first reflecting member 30 may cover the element lateral surface 202 of the light emitting element 20 directly or with the first guiding member 40 interposed therebetween. Alternatively, the first reflecting member 30 may be formed so as to cover the element lateral surface 202 of the light emitting element 20, the electrode-formation surface 203, the lateral surface of the solder 60 and the lateral surface of the light-transmissive member 50. In the first reflecting member 30, the light reflectivity at the peak emission wavelength of the light emitting element 20 is preferably 70% or more, more preferably 80% or more, still more preferably 90% or more. As a material for the first reflecting member 30, for example, a member obtained by incorporating a white pigment in a base material can be used. It is preferable to use a resin for a base material of the first reflecting member 30, and use of, for example, a silicone resin, an epoxy resin, a phenol resin, a polycarbonate resin, an acrylic resin, a modified resin thereof, or the like is preferable. In particular, it is preferable to use an epoxy resin as a base material for the first reflecting member 30. Using an epoxy resin allows for increasing hardness of the light emitting device as compared to a case where a silicone resin is used. Further, silicone resins and modified silicone resins have a high heat resistance and light resistance, and thus are preferably used for a base material of the first reflecting member 30. With the first reflecting member 30 having a predetermined thickness which does not allow light from the light emitting element 20 to be transmitted, transmission of light emitted from the light emitting element 20 through the first reflecting member can be reduced, which allows increase of light extraction efficiency. The phrase "light from the light emitting element is not transmitted" refers to that preferably 50% or more, more preferably 60% or more, still more preferably 70% or more of light emitted from the light emitting element is not transmitted.

External Connection Electrode

The external connection electrodes 71 and 72 are intended to connect the light emitting device 100 to external electrodes. The external connection electrodes 71 and 72 are formed in contact with the lower surfaces of the element electrodes 21 and 22 and the solder 60. Each of the external connection electrodes 71 and 72 is formed so as to have an area equal to or greater than the area of the lower surfaces of the element electrode 21 and the solder 60, or the area of the lower surfaces of the element electrode 22 and the solder 60. The external connection electrodes 71 and 72 are formed by, for example, depositing silver, platinum, aluminum, rhodium, gold, an alloy thereof or the like in a layered form such that the layers are separated from each other. The external connection electrodes 71 and 72 may extend to the periphery of the lower surface of the light emitting device, or the external connection electrodes 71 and 72 may be separated from the periphery of the lower surface of the light emitting device. When the external connection electrodes 71 and 72 extend to the peripheral edge of the lower surface of the light emitting device, electricity is easily supplied from the external connection electrodes 71 and 72 even in the case of a side-emission type light emitting device which is mounted such that a lateral surface of the light emitting device faces a mounting surface of a mounting substrate. Further, when the external connection electrodes 71 and 72 are separated from the periphery of the lower surface of the light emitting device, generation of burrs on the external connection electrodes 71 and 72 can be prevented.

The light emitting device 100 includes the components described above. With the light emitting device 100 not having a base member on which the light emitting element is placed, the length between the upper surface (light extraction surface 501) and the lower surface (external connection electrodes 71 and 72) of the light emitting device can be reduced. Thus, the light emitting device 100 can be used for backlight devices of liquid crystal displays, various kinds of lighting fixtures, large displays, various kinds of display devices for advertisements, destination guides and the like, projector devices, and image reading apparatuses in digital video cameras, facsimile machines, copying machines, scanners and the like. Further, in the light emitting device 100, the solder 60 covering the lateral surfaces of the element electrodes 21 and 22 is in contact with the external connection electrodes 71 and 72, and therefore the heat dissipation property of the light emitting device is improved as compared to a case where solder covering the lateral surfaces of element electrodes is not formed. The light extraction surface 501 of the light emitting device is a surface which is positioned on the uppermost surface of the light emitting device and from which light from the light emitting element is extracted. Thus, when the upper surface of the light-transmissive member 50 is positioned on the uppermost surface of the light emitting device, the light-transmissive member 50 has the light extraction surface 501 of the light emitting device. Further, when the upper surface of the light emitting element 20 is positioned on the uppermost surface of the light emitting device, the light emitting element 20 has the light extraction surface 501 of the light emitting device.

A method of manufacturing a light emitting device will now be described with reference to FIGS. 3A, 3B, 4A, 4B and 5A to 5G.

Figure 3A:
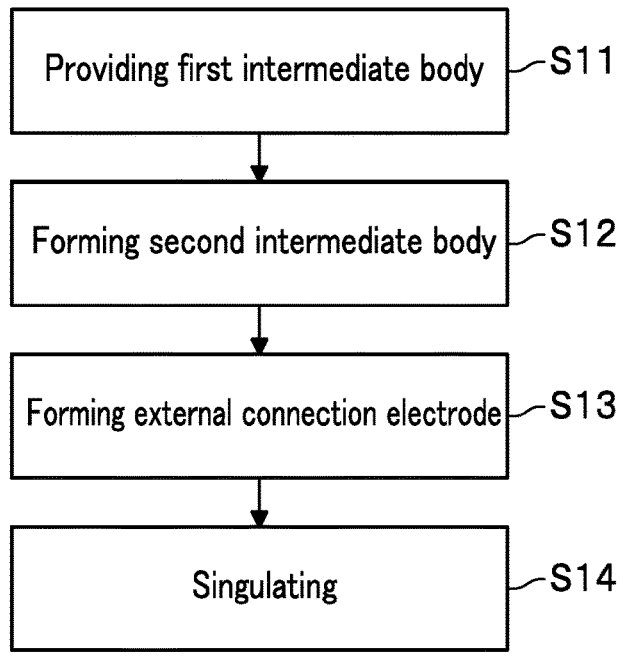
FIG. 3A is a flow chart illustrating a method of manufacturing a light emitting device according to the first embodiment of the present disclosure.
Figure 3B:
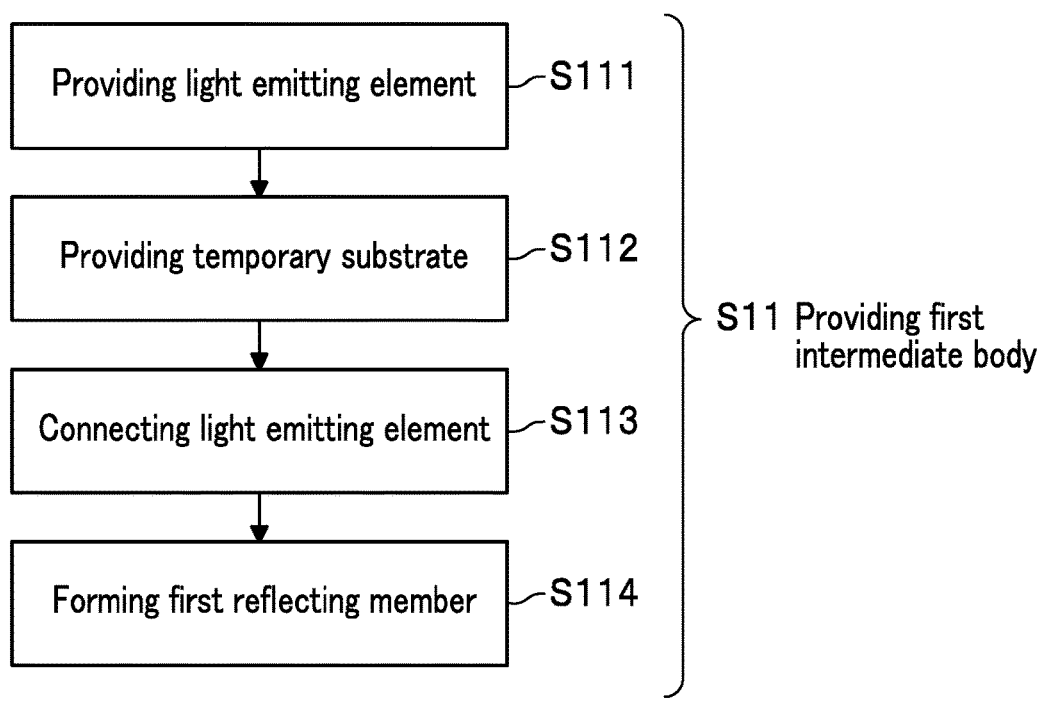
FIG. 3B is a flow chart showing one example of a first intermediate body providing step in the method of manufacturing a light emitting device according to the first embodiment of the present disclosure.
Figure 4A:
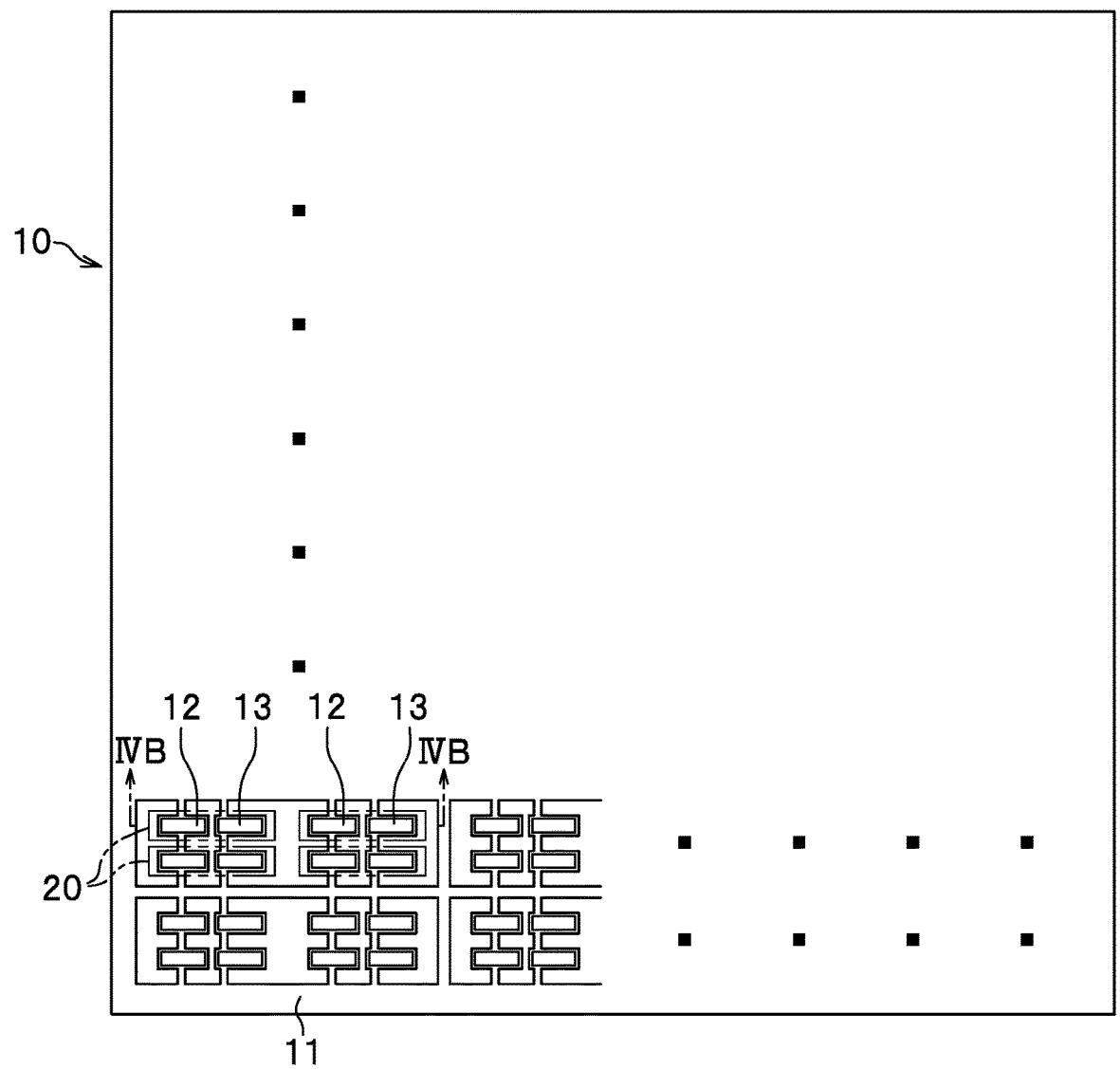
FIG. 4A is a plan view schematically showing a temporary substrate in the method of manufacturing a light emitting device according to the first embodiment of the present disclosure, in which illustrations of some components are not shown.
Figure 4B:
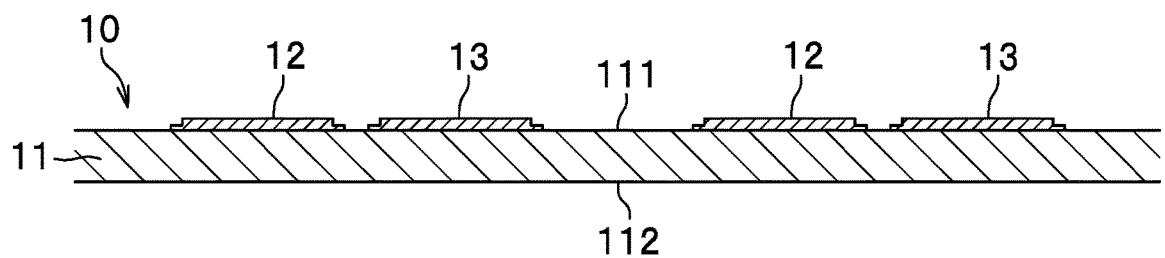
FIG. 4B is a cross-sectional view taken along line IVB-IVB in FIG. 4A.
Figure 5A:
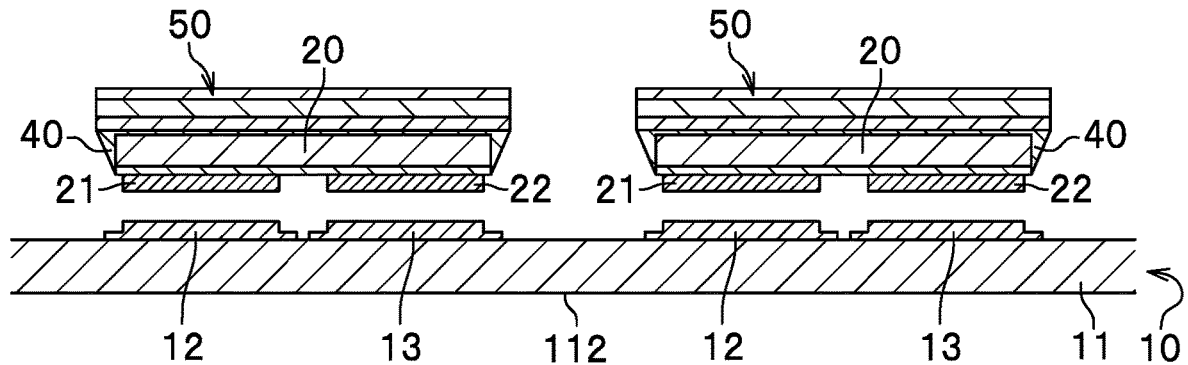
FIG. 5A is a diagram showing the method of manufacturing a light emitting device according to the first embodiment of the present disclosure, and is a cross-sectional view schematically showing connecting of a light emitting element and the temporary substrate.
Figure 5B:
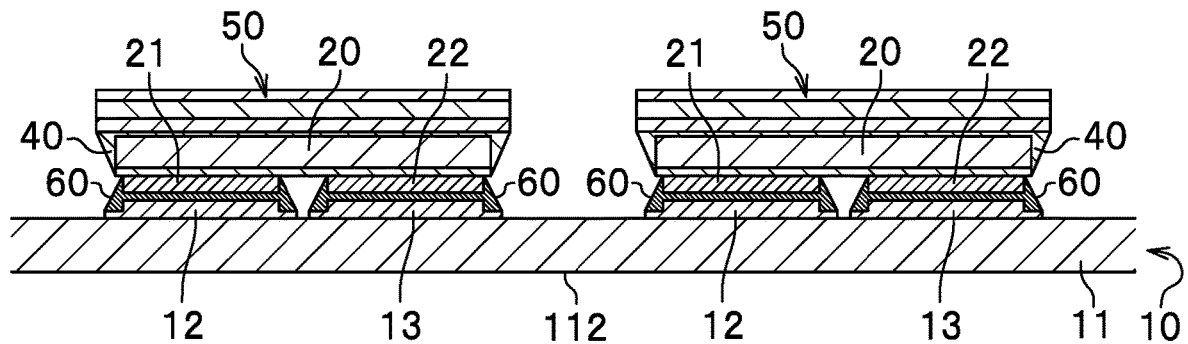
FIG. 5B is a diagram showing the method of manufacturing a light emitting device according to the first embodiment of the present disclosure, and is a cross-sectional view schematically showing a state in which the light emitting element is connected to the temporary substrate via a solder.
Figure 5C:
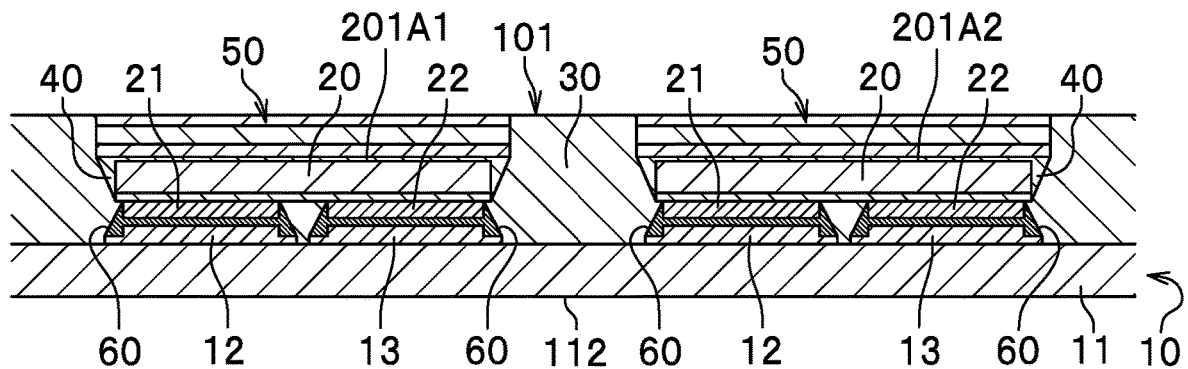
FIG. 5C is a diagram showing the method of manufacturing a light emitting device according to the first embodiment of the present disclosure, and is a cross-sectional view schematically showing a state in which a first reflecting member is formed on the temporary substrate connected to the light emitting element.
Figure 5D:
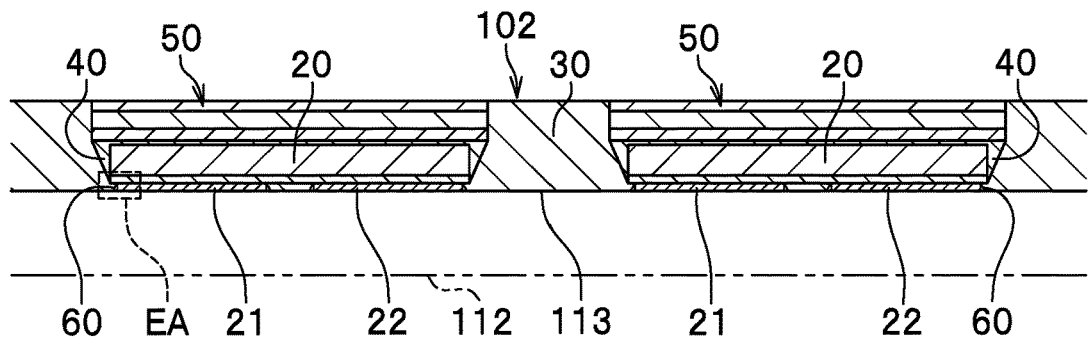
FIG. 5D is a diagram showing the method of manufacturing a light emitting device according to the first embodiment of the present disclosure, and is a cross-sectional view schematically showing a second intermediate body having a second lower surface formed by cutting a first lower surface of a first intermediate body.
Figure 5E:
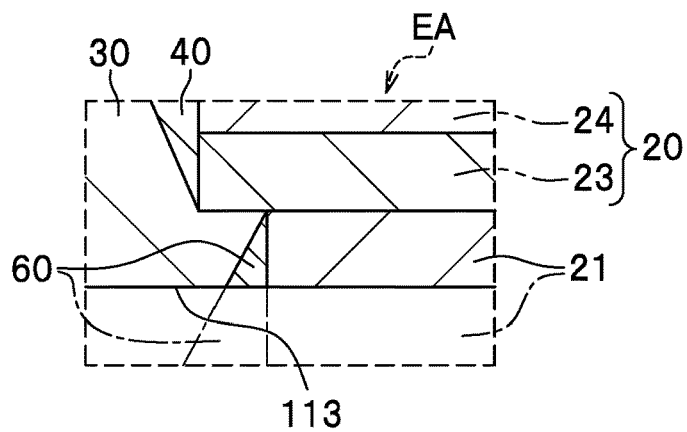
FIG. 5E is a diagram showing the method of manufacturing a light emitting device according to the first embodiment of the present disclosure, and schematically shows a solder portion indicated by EA in FIG. 5D.
Figure 5F:
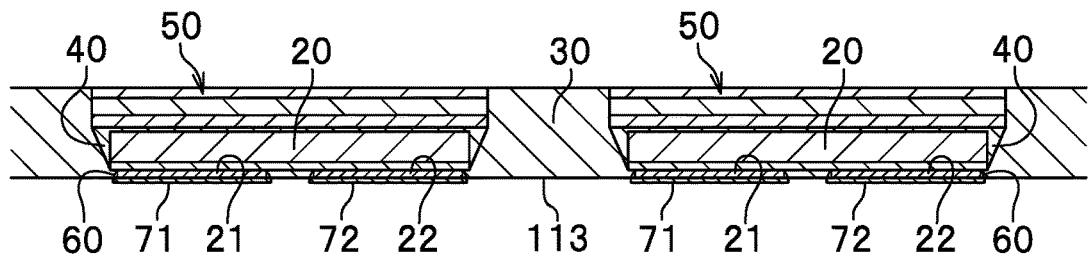
FIG. 5F is a diagram showing the method of manufacturing a light emitting device according to the first embodiment of the present disclosure, and is a cross-sectional view schematically showing a state in which external connection electrodes are formed on the second lower surface of the second intermediate body.
Figure 5G:
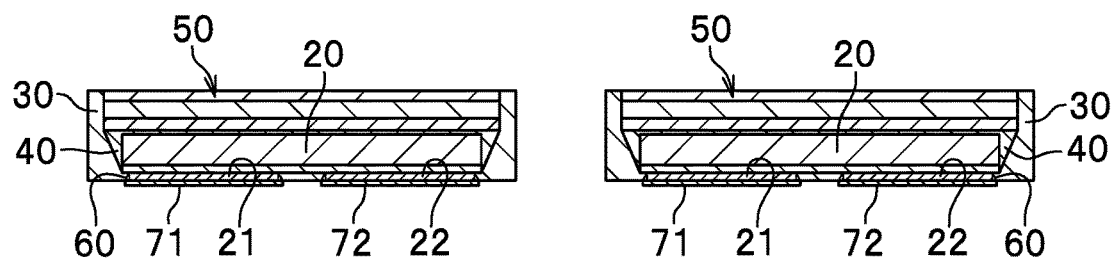
FIG. 5G is a diagram showing the method of manufacturing a light emitting device according to the first embodiment of the present disclosure, and is a cross-sectional view schematically showing light emitting devices singulated after forming the external connection electrodes on the second intermediate body.

FIG. 3A is a flow chart illustrating a method of manufacturing a light emitting device according to the first embodiment. FIG. 3B is a flow chart showing one example of a first intermediate body providing step in the method of manufacturing a light emitting device according to the first embodiment. FIG. 4A is a plan view schematically showing a temporary substrate in a partially omitted manner in the method of manufacturing a light emitting device according to the first embodiment. FIG. 4B is a sectional view taken along line IVB-IVB in FIG. 4A. FIGS. 5A to 5G are explanatory diagrams showing the method of manufacturing a light emitting device according to the first embodiment, where FIG. 5A is a cross-sectional view schematically showing connecting of the light emitting element and the temporary substrate, FIG. 5B is a cross-sectional view schematically showing a state in which the light emitting element and the temporary substrate are connected to each other via a solder, FIG. 5C is a cross-sectional view schematically showing a state in which a first reflecting member is formed on the temporary substrate connected to the light emitting element, FIG. 5D shows a second intermediate body with a second lower surface formed by cutting a first lower surface of a first intermediate body, FIG. 5E shows an enlarged form of a solder portion in FIG. 5D, FIG. 5F is a cross-sectional view schematically showing a state in which external connection electrodes are formed on the second lower surface of the second intermediate body, and FIG. 5G is a cross-sectional view schematically showing light emitting devices singulated after forming the external connection electrodes on the second intermediate body.

The method of manufacturing a light emitting device includes at least the following steps:

(1) first intermediate body providing step S11 of providing a first intermediate body which includes a temporary substrate including a base having a first lower surface positioned on a side opposite to an upper surface and a pair of first wirings disposed on the upper surface, and a light emitting element disposed on the first wirings and connected via a plurality of solders to a pair of element electrodes formed on an electrode-formation surface;

(2) second intermediate body forming step S12 of removing a portion of the temporary substrate from the first lower surface side of the base, and forming a second intermediate body having a second lower surface including the pair of element electrodes and the plurality of solders; and (3) external connection electrode forming step S13 of forming on the second lower surface a pair of external connection electrodes covering the pair of element electrodes and the plurality of solders.

These steps will be described below.

Providing First Intermediate Body

First intermediate body providing step S11 is a step of providing a first intermediate body 101 in which the light emitting element 20 is connected to the temporary substrate 10 through the plurality of solders 60. For ease of description, components shown in a schematic cross-sectional view taken along line IVB-IVB in FIG. 4A will be mainly described below. That is, in the first intermediate body 101, a pair of light emitting elements 20 is arranged in rows and columns, but a portion in which two light emitting elements 20 are disposed will be mainly described.

As shown in FIGS. 5A and 5B, the first intermediate body 101 is formed by connecting the light emitting element 20 to the temporary substrate 10 in first intermediate body providing step S11. In the light emitting element 20, the element electrodes 21 and 22 are connected through the solder 60 to a pair of first wirings 12 and 13 formed on an upper surface 111 of the base 11 of the temporary substrate 10. The areas of the first wirings 12 and 13 may be larger than the areas of the element electrodes 21 and 22, respectively, of the light emitting element 20. This allows for facilitating formation of solder that covers the lateral surfaces of the element electrodes. The first wirings 12 and 13 may have projections opposed to the element electrodes 21 and 22, respectively, of the light emitting element 20. When the first wirings 12 and 13 have projections, position adjustment can be easily performed by means of a self-alignment effect at the time of connecting the element electrodes 21 and 22 by the solder 60.

The areas of the first wirings 12 and 13 may be equal to the areas of the element electrodes 21 and 22, respectively, of the light emitting element 20. This allows for improving the positional accuracy of the light emitting element 20 with respect to the first wirings 12 and 13.

The projection has any appropriate size in top view, and the size of the projection is preferably within ±10% with respect to the size of each of the element electrodes 21 and 22 opposed to the projection. This allows for increasing self-alignment effect. Further, the projection may have any appropriate thickness, and a thickness of the projection is preferably 3 μm or more and 100 μm or less, more preferably 5 μm or more and 50 μm or less.

As a material for the first wirings, a known metal material can be used. Examples of a material of the first wiring include copper, iron, nickel, tungsten, chromium, aluminum, silver, gold, titanium, palladium, rhodium, and an alloy thereof. In particular, it is preferable to use copper or a copper alloy as a material for the first wiring. This allows for improving the heat dissipation property of the first wiring. Further, the surface layer of the first wiring may be plated with a known metal material. For example, it is preferable that the surface layer of each first wiring is plated with gold. This allows for reducing oxidation of the first wirings.

The temporary substrate may include second wiring formed on the lower surface of the base 11, in addition to the first wirings formed as wirings on the upper surface of the base 11. Further, the temporary substrate may include second wirings which are electrically connected to a pair of first wirings, respectively. As a material for the second wiring, the same material as that for the first wiring can be used.

As described later, the temporary substrate 10 used here is removed once the light emitting device 100 is completed.

As one example, the maximum thickness between the upper surface 111 and a first lower surface 112 of the base 11 is preferably 100 μm or more and 500 μm or less. When the thickness between the upper surface 111 and the first lower surface 112 is 100 μm or more, the strength of the base is enhanced. Further, in removal of the temporary substrate 10 as described later, the first lower surface 112, the first wirings 12 and 13 and a part of the element electrodes 21 and 22 are removed to reduce the thickness of the light emitting device.

The base 11 can be formed using an insulating member such as a resin or fiber reinforced resin, a ceramic or glass. Examples of the resin or fiber reinforced resin include epoxy, glass epoxy, bismaleimide triazine (BT) and polyimide. Examples of the ceramic include aluminum oxide, aluminum nitride, zirconium oxide, zirconium nitride, titanium oxide, titanium nitride and mixtures thereof.

In the first intermediate body 101, the light-transmissive member 50 covering the light extraction surface 201 may be connected to the light emitting element 20. When the light emitting element 20 is covered with the light-transmissive member 50, the light emitting element 20 can be protected from external stress. The "first intermediate body 101" as used herein refers to a structure in which the element electrodes 21 and 22 of the light emitting element 20 are connected to the first wirings 12 and 13, respectively, of the base 11 via the solders 60. Further, in the light emitting device 100, the upper surface of the light-transmissive member 50 is the light extraction surface 501 of the light emitting device 100.

As shown in FIG. 5C, the first intermediate body 101 may be provided with the first reflecting member 30 in a first reflecting member forming step after the light emitting element 20 is disposed. The first reflecting member 30 may cover the lateral surface of the light-transmissive member 50, the electrode-formation surface 203 of the light emitting element 20 and the lateral surface of the solder 60. The first reflecting member 30 is disposed to cover the lateral surfaces of the light emitting element 20 such that the first light guiding member 40 is disposed between the first reflecting member 30 and the lateral surfaces of the light emitting element 20. The first reflecting member 30 is formed by, for example, placing in upper and lower molds the temporary substrate 10 on which the light emitting element 20 are disposed, and filling the molds with a molten member which will be the first reflecting member 30 when cured. The first intermediate body 101 is provided with the first reflecting member 30.

Forming Second Intermediate Body

As shown in FIGS. 5D and 5E, after providing the first intermediate body 101 in which the first reflecting member is formed, a second intermediate body forming step S12 is performed, in which a portion of the first intermediate body 101 is removed to obtain a second lower surface 113, forming a second intermediate body 102. In the second intermediate body forming step S12, the first intermediate body 101 is subjected to grinding from the first lower surface 112 side of the first intermediate body 101 using, for example, a grinding machine, such that a portion of each of the element electrodes 21 and 22 is ground, to obtain the second lower surface 113. Accordingly, the second intermediate body 102 is formed.

In the second intermediate body forming step S12, a region from the first lower surface 112 the base 11 to a portion of each of the element electrodes 21 and 22 of the light emitting element 20 is removed to reduce the thickness of the first intermediate body 101. Removing a portion of the first intermediate body 101 from the first lower surface 112 of the temporary substrate such that a portion of the element electrodes 21 and 22 is removed, which thins the first intermediate body 101 and forms the second lower surface 113 to obtain the second intermediate body 102, allows for manufacturing the thin light emitting device 100. For removing the region extending to a part of the element electrodes 21 and 22 in formation of the second lower surface 113, a method such as grinding, etching, cutting or blasting can be used. Grinding is preferably employed for removing such that a portion of the element electrodes 21 and 22 is removed. This allows the lower surface of the first reflecting member 30, the lower surfaces of the element electrodes 21 and 22 and the lower surface of the solder 60 to be in the same plane, so that the second lower surface 113, which is the lower surface of the second intermediate body 102, can be a planar surface. Accordingly, when a plurality of light emitting devices 100 is manufactured, variations in light emitting devices 100 can be reduced.

After the second lower surface 113 is formed, cleaning may be carried out so that grinding chips are not deposited on and do not remain on various portions of the second intermediate body 102. The cleaning is carried out by spraying air to the second intermediate body 102, or immersing the intermediate body in a cleaning liquid or spraying a cleaning liquid containing solid carbon dioxide.

Forming External Connection Electrode

Subsequently, external connection electrodes forming step S13 is carried out as shown in FIG. 5F. In the external connection electrode forming step S13, a pair of external connection electrodes 71 and 72 are formed on the second lower surface 113 such that the external connection electrodes 71 and 72 cover the element electrodes 21 and 22 and the solder 60. The term "a pair of external connection electrodes 71 and 72" as used herein refers to two electrodes which function as positive and negative electrodes. Thus, the second intermediate body 102 includes a pair of external connection electrodes 71 and 72 separated from each other so as to serve as positive and negative electrodes. Each pair of external connection electrodes 71 and 72 before singulation may be separated from or connected to an adjacent pair of external connection electrodes 71 and 72. Each of the external connection electrodes 71 and 72 may be a metal layer, a metal film, or a metal plate, and is configured to be electrically connected.

For forming a pair of external connection electrodes 71 and 72, a known method such as sputtering, vapor deposition or plating may be used. Sputtering is preferably employed for forming a pair of external connection electrodes 71 and 72. By using a sputtering, bonding strength between the second lower surface 113 and the external connection electrodes 71 and 72 is easily enhanced, so that detachment of the external connection electrodes 71 and 72 from the second lower surface may be prevented. When a pair of external connection electrodes 71 and 72 are formed by sputtering, a mask or the like may be used to prevent connection between a pair of external connection electrodes 71 and 72, which may cause short-circuit.

When the external connection electrodes 71 and 72 are formed, a metal layer continuously covering the second lower surface 113 may be formed, followed by forming the electrodes on the second lower surface 113 so as to obtain a pair of external connection electrodes 71 and 72. That is, at least a part of the metal layer continuously formed on the element electrodes 21 and 22 is removed to form a pair of external connection electrodes 71 and 72 electrically connected to the element electrodes 21 and 22. Examples of a technique for removing a part of the metal layer include a known method such as laser light irradiation, etching and blasting.

Laser light irradiation is preferable as a technique for removing a part of the metal layer. By performing laser light irradiation, the metal layer can be patterned without use of a mask or the like. Irradiating the metal layer is irradiated with laser light can cause laser abrasion. Accordingly, a part of the metal layer is removed. By irradiating laser light, the metal layer is patterned, so that the metal layer can be formed into external connection electrodes. The laser abrasion refers to that, when a surface of a solid is irradiated with laser light having an irradiation intensity of a certain value (threshold) or greater, the irradiated portion of the surface of the solid is removed.

When laser irradiation is employed for removing a part of the metal layer, the laser light preferably has a wavelength at which the metal layer has a low reflectance, for example a wavelength at which the metal layer has a reflectance of 90% or less. For example, when the outermost surface of the metal layer is Au, it is preferable to use a laser light having a wavelength shorter than a green region (for example, laser light having a wavelength shorter than 550 nm) rather than a laser light in a red region (for example, laser light having a wavelength of 640 nm). This allows for efficiently causing abrasion, to that mass productivity can be increased.

Singulation Step

As shown in FIG. 5G, in a singulation step S14, singulation into light emitting devices 100 is performed. In the step S14, the first reflecting member 30 are cut between the lateral surfaces of adjacent light emitting elements 20 in the second intermediate body 102 using a blade dicing method or a laser dicing method, so that singulation into light emitting devices 100 is performed. In this manner, a plurality of light emitting devices 100 can be manufactured.

Second Embodiment

Figure 6A:
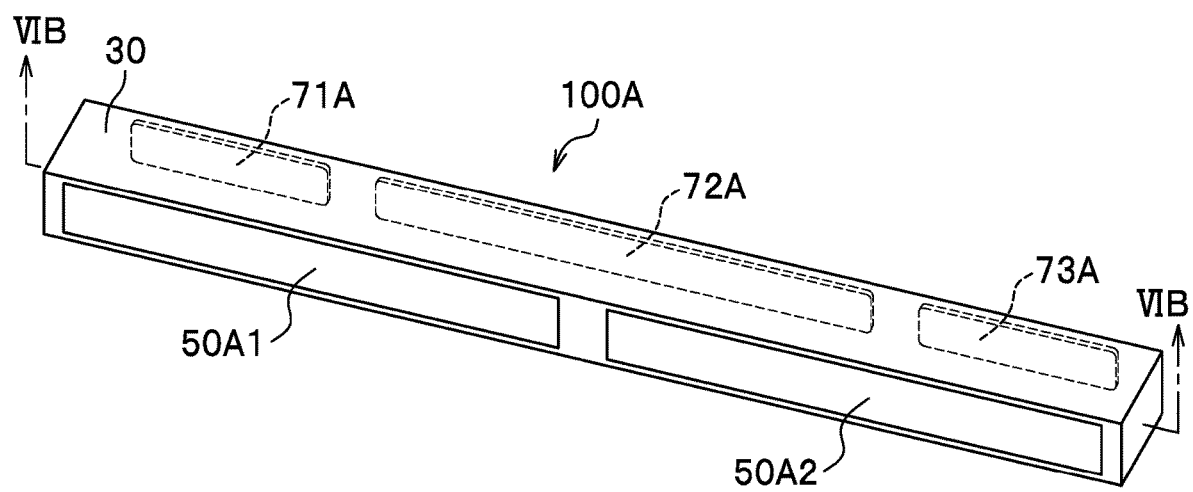
FIG. 6A is a perspective view schematically showing the entirety of a light emitting device according to a second embodiment of the present disclosure when viewed from a side of a first light-transmissive member and a second light-transmissive member.
Figure 6B:
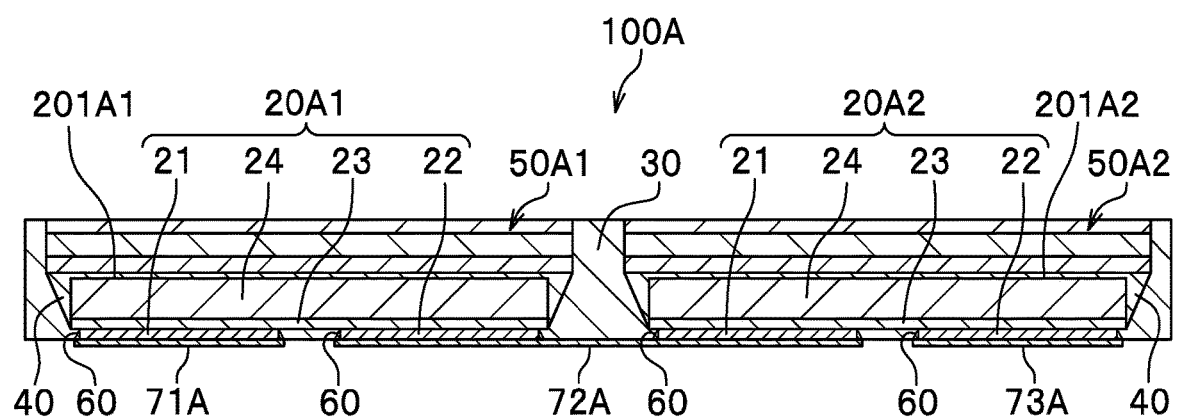
FIG. 6B is a schematic cross-sectional view of the light emitting device according to the second embodiment of the present disclosure taken along line VIB-VIB in FIG. 6A.

A light emitting device 100A according to a second embodiment will be described with reference to FIGS. 6A and 6B. FIG. 6A is a perspective view schematically showing the entirety of the light emitting device according to the second embodiment from the first light-transmissive member and second light-transmissive member side. FIG. 6B is a schematic cross-sectional view taken along line VIB-VIB in FIG. 6A for the light emitting device according to the second embodiment. The light emitting device 100A has the same configuration as that of two consecutive light emitting devices 100 described above.

The light emitting device 100A includes a first light emitting element 20A1 and a second light emitting element 20A2, and has a configuration in which a first light-transmissive member 50A1 and a second light-transmissive member 50A2 are formed so as to be opposed to the first light emitting element 20A1 and the second light emitting element 20A2, respectively.

The first light emitting element 20A1 and the second light emitting element 20A2 are arranged along a straight line and separately from each other. The first light emitting element 20A1 and the second light emitting element 20A2, which emit light of the same color or light of different colors, may be arranged side by side. When the peak emission wavelengths of the first light emitting element 20A1 and the second light emitting element 20A2 are the same, the peak emission wavelengths of the first light emitting element 20A1 and the second light emitting element 20A2 may be 430 nm or more and less than 490 nm (wavelength range in blue region). Further, when the peak emission wavelengths of the first light emitting element 20A1 and the second light emitting element 20A2 are different from each other, there may be the first light emitting element 20A1 in which the peak emission wavelength is 430 nm or more and less than 490 nm (wavelength range in blue region) and the second light emitting element 20A2 in which the peak emission wavelength is 490 nm or more and less than 570 nm (wavelength range in green region). This allows for improving the color reproductivity of the light emitting device 100A. The same peak emission wavelength means that may be a variation of about ±10 nm.

The first light-transmissive member 50A1 and the second light-transmissive member 50A2 have the same configuration as that of the light-transmissive member 50 described above, and are formed so as to be opposed to the first light emitting element 20A1 and the second light emitting element 20A2, respectively. The first light-transmissive member 50A1 and the second light-transmissive member 50A2 may have the same configuration, or different configurations. When the first light-transmissive member 50A1 and the second light-transmissive member 50A2 have different configurations, for example, the first light-transmissive member 50A1 and the second light-transmissive member 50A2 may contain different wavelength conversion particles. Further, one of the first light-transmissive member 50A1 and the second light-transmissive member 50A2 may include wavelength conversion particles while the other does not include wavelength conversion particles. A first reflecting member 30 is formed so as to expose the upper surfaces of the first light-transmissive member 50A1 and the second light-transmissive member 50A2 and integrally cover the lateral surfaces of the first light emitting element 20A1 and the second light emitting element 20A2 with a first light guiding member 40 interposed between the first reflecting member 30 and these surfaces.

External connection electrodes 71A, 72A and 73A are formed at three locations on the lower surface of the first reflecting member 30 so as to be electrically connected while facing the lower surfaces of element electrodes 21 and 22 and the lower surface of solder 60. The first external connection electrode 71A is formed so as to be connected to one element electrode 21 of the first light emitting element 20A1 and the solder 60. Further, the third external connection electrode 73A is formed so as to be connected to the other element electrode 22 of the second light emitting element 20A2 and the solder 60. Further, the second external connection electrode 72A is formed between the first external connection electrode 71A and the third external connection electrode 73A so as to be connected to the other element electrode 22 of the first light emitting element 20A1 and the solder 60, and one element electrode 21 of the second light emitting element 20A2 and the solder 60. The first light emitting element 20A1 and the second light emitting element 20A2 are configured such that the light emitting elements can be connected either in series or in parallel by changing the positions of the positive and negative element electrodes 21 and 22.

A method of manufacturing the light emitting device 100A according to the second embodiment will now be described.

The light emitting device 100A is manufactured by essentially the same method as the above-described method of manufacturing a light emitting device. In a step of forming the first reflecting member 30, the first reflecting member 30 is formed so as to expose the upper surfaces of the first light-transmissive member 50A1 and the second light-transmissive member 50A2. The first reflecting member 30 is formed so as to integrally cover the lateral surface of the solder 60, an electrode-formation surface, and the lateral surfaces of the first light emitting element 20A1 and the second light emitting element 20A2 with the first light guiding member 40 interposed between the first reflecting member 30 and the lateral surfaces of the first light emitting element 20A1 and the second light emitting element 20A2.

By carrying out a singulating step so that light emitting devices are singulated such that each light emitting device including a plurality of light emitting elements 20 (two light emitting elements) (first light emitting element 20A1 and second light emitting element 20A2), light emitting devices 100A can be manufactured.

The light emitting device 100A is connected to the external connection electrodes 71A, 72A and 73A through the solder 60 and the element electrodes 21 and 22, so that the heat dissipation property of the light emitting device is improved. Further, in the light emitting device 100A, a plurality of light emitting elements (two light emitting elements in the drawings) can be used, and therefore color reproductivity can be improved.

Third Embodiment

Figure 7A:
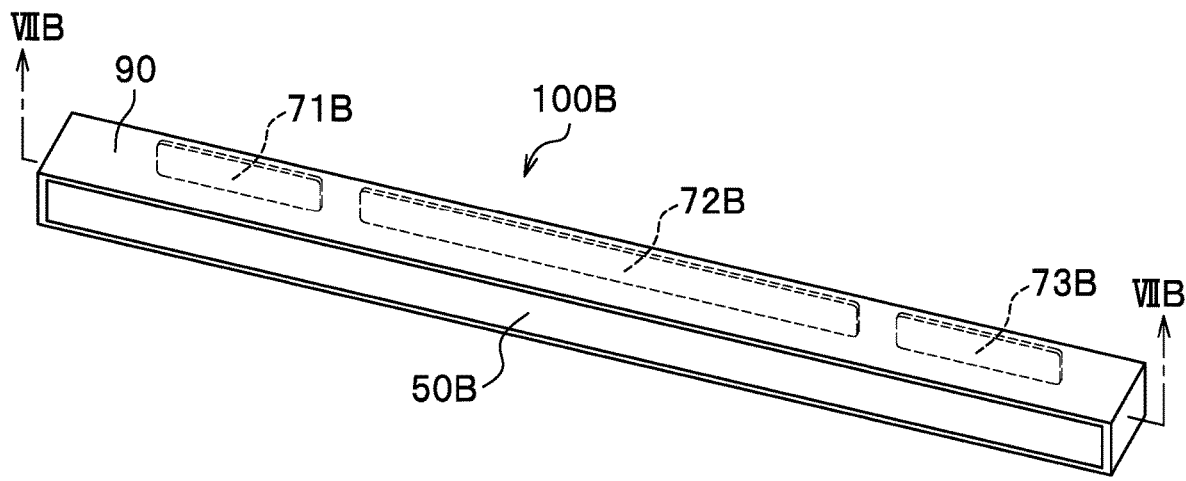
FIG. 7A is a perspective view schematically showing the entirety of a light emitting device according to a third embodiment of the present disclosure from the first light-transmissive member and second light-transmissive member side.
Figure 7B:
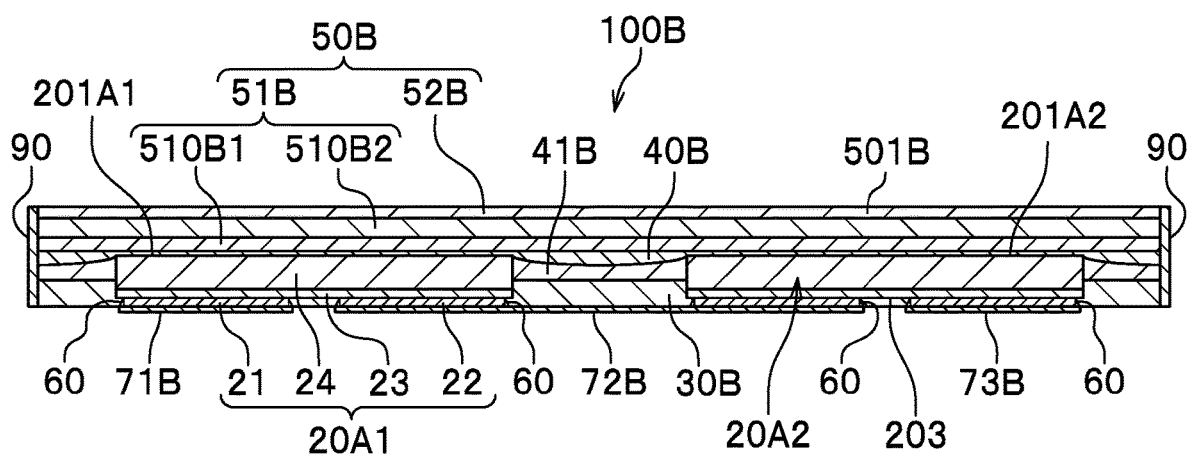
FIG. 7B is a schematic cross-sectional view of the light emitting device according to the third embodiment of the present disclosure taken along line VIIB-VIIB in FIG. 7A.

A light emitting device 100B according to a third embodiment will now be described with reference to FIGS. 7A and 7B. FIG. 7A is a perspective view schematically showing the entirety of the light emitting device according to the third embodiment from the first light-transmissive member and second light-transmissive member side. FIG. 7B is a schematic cross-sectional view taken along line VIIB-VIIB in FIG. 7A for the light emitting device according to the third embodiment. A first light emitting element 20A1 and a second light emitting element 20A2 may be described as a light emitting element 20.

The configuration of the light emitting device 100B is different from the configuration of the above-described light emitting device 100A in that the light emitting device 100B includes a first reflecting member 30B, a second reflecting member 90, a first light guiding member 40B and a second light guiding member 41B. Further, and one light-transmissive member 50B is formed so as to face the first light emitting element 20A1 and the second light emitting element 20A2.

Descriptions of the components described above may be omitted with these components given the same symbols as described above.

One light-transmissive member 50B is disposed so as to face a plurality of light extraction surfaces 201A1 of first light emitting elements 20A1 and light extraction surfaces 201A2 of second light emitting elements 20A2. The light-transmissive member 50B is provided on the light extraction surfaces 201A1 of first light emitting elements 20A1 and the light extraction surfaces 201A2 of second light emitting elements 20A2 with the first light guiding member 40B interposed between the light-transmissive member 50B and these surfaces. Further, the light-transmissive member 50B includes a light transmitting layer 52B and a wavelength conversion layer 51B. Further, the wavelength conversion layer 51B includes a first wavelength conversion layer 510B1 and a second wavelength conversion layer 510B2. The light-transmissive member 50B is different in size from and identical in configuration to the light-transmissive member 50 described above.

The first light guiding member 40B is formed so as to face each of the light extraction surface 201A of the first light emitting element 20A1 and the light extraction surface 201A2 of the second light emitting element 20A2. The first light guiding member 40B is also formed on the second light guiding member 41B. The first light guiding member 40B is formed in such a manner that a portion on the second light guiding member 41B has a thickness larger than that of a portion facing the light extraction surface 201A and the light extraction surface 201A2.

The second light guiding member 41B is formed continuously under the first light guiding member 40B so as to cover the whole or a part of an element substrate 24 of the light emitting element 20. The first light guiding member 40B and the second light guiding member 41B may be the same member as the first light guiding member 40 described above, or may be formed so as to contain different materials among the materials of the members described above.

The first reflecting member 30B is formed under the second light guiding member 41B so as to cover the lateral surface of a part of the element substrate 24 and the lateral surface of the whole of a semiconductor layered body 23 and cover an electrode-formation surface 203 of the light emitting element 20 and the lateral surface of solder 60. Further, the lower surface of the first reflecting member 30B forms the same flat surface with the lower surfaces of element electrodes 21 and 22, the lower surface of the solder 60 and the lower surface of a second reflecting member 90.

The second reflecting member 90 is formed in a frame shape so as to cover the lateral surface of the light-transmissive member 50B, the lateral surface of the first light guiding member 40B, the lateral surface of the second light guiding member 41B and the lateral surface of the first reflecting member 30B. The second reflecting member 90 forms an outer lateral surface of the light emitting device 100B.

The first reflecting member 30B and the second reflecting member 90 can be formed of the same material as that of the first reflecting member 30 described above. Alternatively, the first reflecting member 30B and the second reflecting member 90 can be made of different materials among the materials described above. When the first reflecting member 30B contains a white pigment in a base material, it is preferable the white pigment is disposed predominantly at the lower surface side, which corresponds to the external connection electrodes side. This allows light from the light emitting element 20 to be less easily shielded by the white pigment, so that the light extraction efficiency of the light emitting device 100B can be enhanced.

External connection electrodes 71B, 72B and 73B are formed so as to be electrically connected while facing the lower surfaces of the element electrodes 21 and 22 and the lower surface of the solder 60. The first external connection electrode 71B is formed so as to be connected to one element electrode 21 of the first light emitting element 20A1 and the solder 60 on the lateral surface of the element electrode 21. Further, the third external connection electrode 73B is formed so as to be connected to the other element electrode 22 of the second light emitting element 20A2 and the solder 60 on the lateral surface of the other element electrode 22. Further, the second external connection electrode 72B is formed between the first external connection electrode 71B and the third external connection electrode 73B so as to be connected to the other element electrode 22 of the first light emitting element 20A1, the solder 60 on the lateral surface of the other element electrode 22, one element electrode 21 of the second light emitting element 20A2 and the solder 60 on the lateral surface of the element electrode 21. The first light emitting element 20A1 and the second light emitting element 20A2 are configured such that the light emitting elements can be connected either in series or in parallel by changing the positions of the positive and negative element electrodes 21 and 22.

Figure 8:
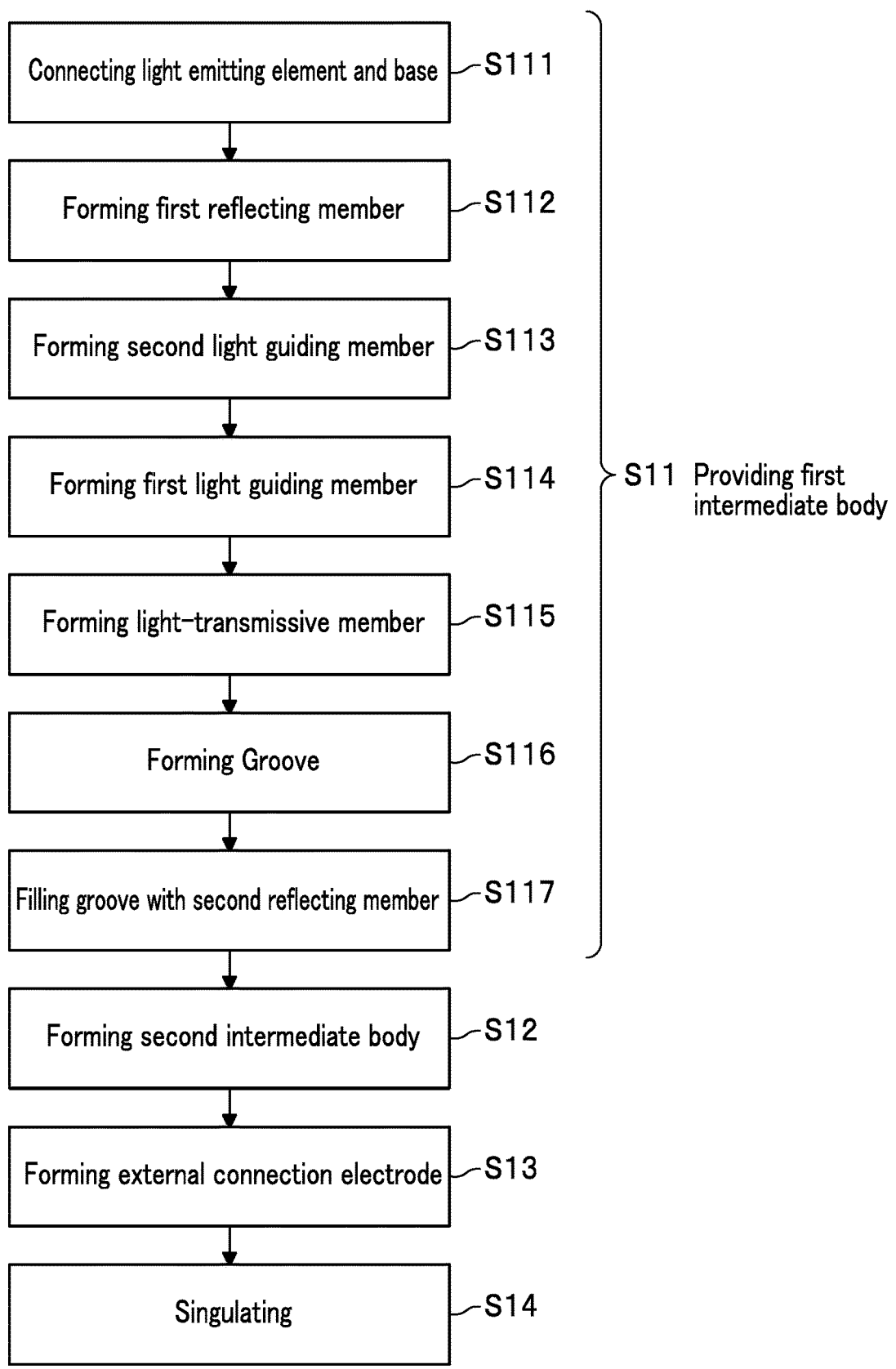
FIG. 8 is a flow chart illustrating a method of manufacturing a light emitting device according to the third embodiment of the present disclosure, and shows one example of a first intermediate body providing step.
Figure 9A:
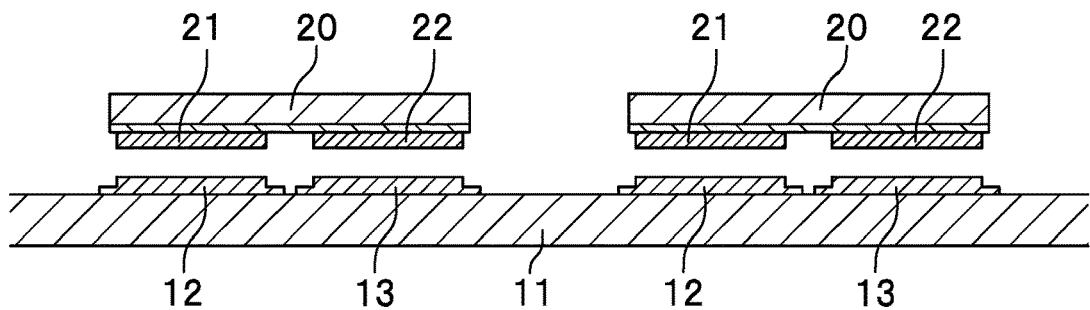
FIG. 9A is a diagram showing the method of manufacturing a light emitting device according to the third embodiment of the present disclosure, and is a cross-sectional view schematically showing connecting of a light emitting element and the temporary substrate.
Figure 9B:
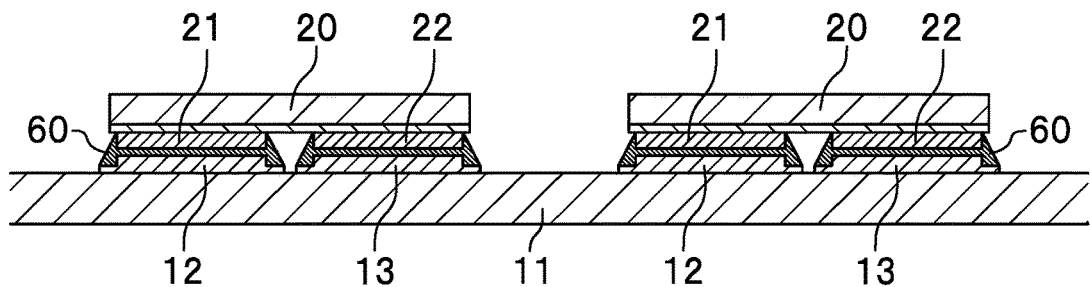
FIG. 9B is a diagram showing the method of manufacturing a light emitting device according to the third embodiment of the present disclosure, and is a cross-sectional view schematically showing a state in which the light emitting element is connected to the temporary substrate via a solder.
Figure 9C:
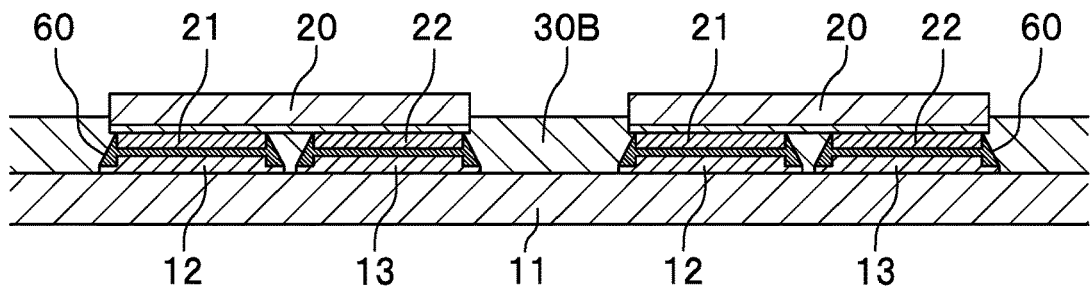
FIG. 9C is a diagram showing the method of manufacturing a light emitting device according to the third embodiment of the present disclosure, and is a cross-sectional view schematically showing a state in which a first reflecting member is formed on the temporary substrate connected to the light emitting element.
Figure 9D:
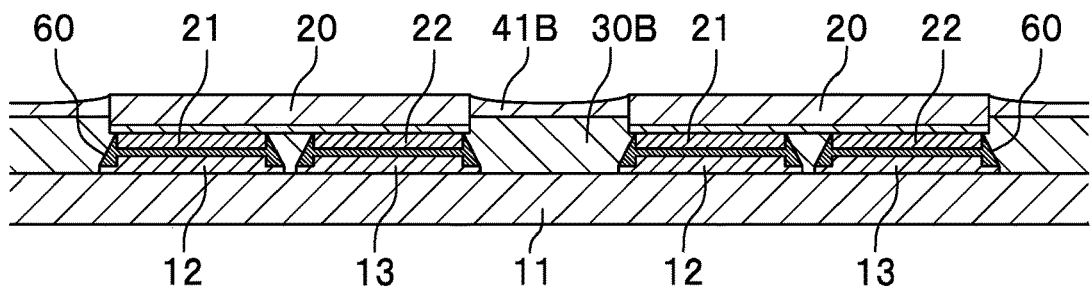
FIG. 9D is a diagram showing the method of manufacturing a light emitting device according to the third embodiment of the present disclosure, and is a cross-sectional view schematically showing a state in which a second light guiding member is formed on the first reflecting member.
Figure 9E:
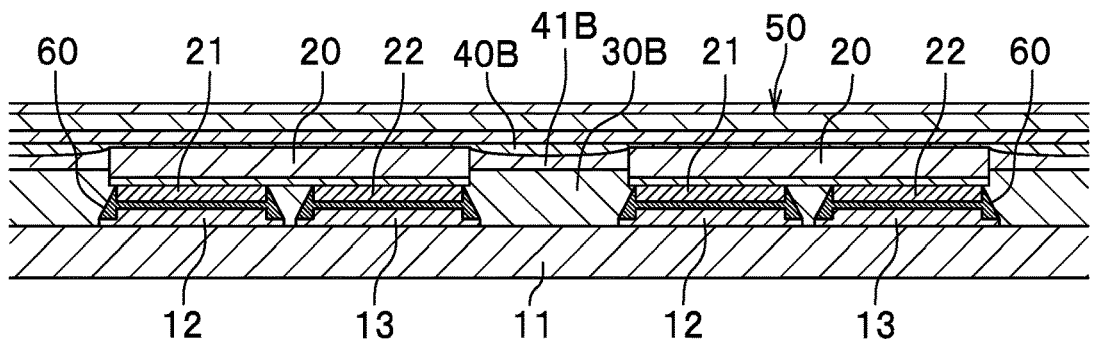
FIG. 9E is a diagram showing the method of manufacturing a light emitting device according to the third embodiment of the present disclosure, and is a cross-sectional view schematically showing a state in which a first light guiding member is formed on the second light guiding member, and a light-transmissive member is formed.
Figure 9F:
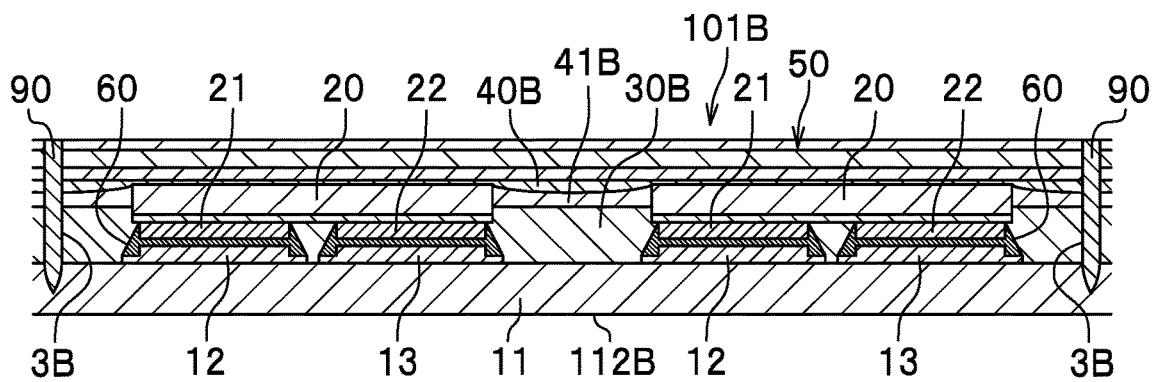
FIG. 9F is a diagram showing the method of manufacturing a light emitting device according to the third embodiment of the present disclosure, and is a cross-sectional view schematically showing a state in which a groove is formed on the light-transmissive member, and a second reflecting member is filled in the grove portion.
Figure 9G:
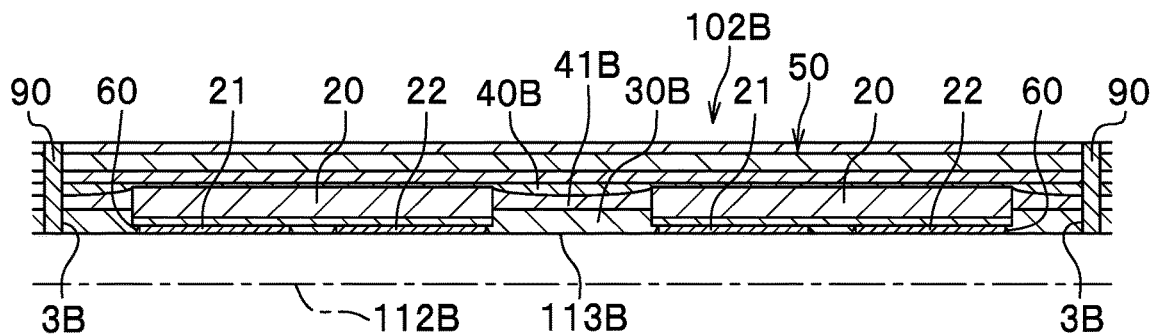
FIG. 9G is a diagram showing the method of manufacturing a light emitting device according to the third embodiment of the present disclosure, and is a cross-sectional view schematically showing a state in which a second intermediate body with a second lower surface formed by grinding a first lower surface of a first intermediate body is formed.

A method of manufacturing a light emitting device according to the third embodiment will now be described with reference to FIGS. 8 to 9H. FIG. 8 is a flow chart illustrating the method of manufacturing a light emitting device according to the third embodiment, and shows one example of a first intermediate body providing step. FIG. 9A is a diagram showing the method of manufacturing a light emitting device according to the third embodiment, and is a cross-sectional view schematically showing a state in which a light emitting element is connected to the temporary substrate. FIG. 9B is a diagram showing the method of manufacturing a light emitting device according to the third embodiment, and is a cross-sectional view schematically showing connecting of the light emitting element and the temporary substrate via a solder. FIG. 9C is a diagram showing the method of manufacturing a light emitting device according to the third embodiment, and is a cross-sectional view schematically showing a state in which a first reflecting member is formed on the temporary substrate connected to the light emitting element. FIG. 9D is a diagram showing the method of manufacturing a light emitting device according to the third embodiment, and is a cross-sectional view schematically showing a state in which a second light guiding member is formed on the first reflecting member. FIG. 9E is a diagram showing the method of manufacturing a light emitting device according to the third embodiment, and is a cross-sectional view schematically showing a state in which a first light guiding member is formed on the second light guiding member, and a light-transmissive member is formed. FIG. 9F is a diagram showing the method of manufacturing a light emitting device according to the third embodiment, and is a cross-sectional view schematically showing a state in which a groove is formed on the light-transmissive member, and a second reflecting member is filled in the grove portion. FIG. 9G is a diagram showing the method of manufacturing a light emitting device according to the third embodiment, and is a cross-sectional view schematically showing a state in which a second intermediate body with a second lower surface formed by grinding a first lower surface of a first intermediate body is formed.

The light emitting device is manufactured in the same process as in the flow chart of the manufacturing method described above, but there may be a difference in contents between the processes. In particular, the first intermediate body providing steps of providing a first intermediate body are different in the following point. That is, the first intermediate body providing step in the third embodiment includes a connecting step S111 of connecting the light emitting element and the base, first reflecting member forming step S112, second light guiding member forming step S113, first light guiding member forming step S114, light-transmissive member forming step S115, groove forming step S116 and second reflecting member groove filling step S117.

As shown in FIGS. 9A and 9B, connecting step S111 of connecting the light emitting element and the base is carried out in first intermediate body providing step S11. In connecting step S111 of connecting the light emitting element and the base, a pair of element electrodes 21 and 22 of the light emitting element 20 is connected to a pair of first wirings 12 and 13 of the temporary substrate 10 through the solder 60. That is, on the temporary substrate 10, a pair of element electrodes 21 and 22 of the first light emitting element 20A1 is connected to one pair of first wirings 12 and 13 through the solder 60. On the temporary substrate 10, a pair of element electrodes 21 and 22 of the second light emitting element 20A2 is connected to the other pair of first wirings 12 and 13. To all the first wirings 12 and 13 formed on the base 11 of the temporary substrate 10, the first light emitting element 20A1 and the second light emitting element 20A2 are connected through the solder 60 in the same manner as described above.

Next, as shown in FIGS. 9C and 9D, first reflecting member forming step S112 and second light guiding member forming step S113 are carried out in the first intermediate body providing step. In first reflecting member forming step S112, the first reflecting member 30B is formed so as to have a height greater than the height of the semiconductor layered body 23 of the light emitting element 20 and equal to the height of a part of the element substrate 24. Further, in second light guiding member forming step S113, the second light guiding member 41B is formed on the first reflecting member 30B so as to have a height equal to the height of the upper surface of the element substrate 24 and cover the lateral surface of the element substrate 24. First reflecting member forming step S112 and second light guiding member forming step S113 may be carried out as separate steps, or as the same step. When first reflecting member forming step S112 and second light guiding member forming step S113 are carried out as the same step, the first reflecting member 30B is formed so as to have a height equal to the height of the second light guiding member 41B, and a reflecting member contained in the first reflecting member 30B, for example a white pigment, is precipitated to form a second light guiding member on the upper layer side and a first reflecting member on the lower layer side.

Next, as shown in FIG. 9E, first light guiding member forming step S114 and light-transmissive member forming step S115 are carried out in the first intermediate body providing step. In first light guiding member forming step S114, the first light guiding member 40B is formed on the light extraction surface of the light emitting element 20 and the second light guiding member 41B. The first light guiding member 40B bonds the light-transmissive member 50B and the light emitting element 20. Subsequently, light-transmissive member forming step S115 is carried out. In light-transmissive member forming step S115, the light-transmissive member 50B is placed so as to cover the light emitting element 20 connected to the temporary substrate 10 before the first light guiding member 40B is cured. First light guiding member forming step S114 and light-transmissive member forming step S115 may be carried out by providing the first light guiding member 40B and the light-transmissive member 50B on the light extraction surface 201 of the light emitting element 20 and the second light guiding member 41B with the first light guiding member 40B applied to the light-transmissive member 50B.

Next, as shown in FIG. 9F, groove forming step S116 and filling step S111 of filling the groove with the second reflecting member are carried out in the first intermediate body providing step. In groove forming step S116, a groove 3B for forming the second reflecting member 90 is formed for each region corresponding to a single light emitting device 100B. The groove 3B is formed in a grid shape in the light-transmissive member 50B in a plan view with a groove depth extending from the light-transmissive member 50B side to the base 11. The groove 3B extends into the base 11 of the temporary substrate 10, but does not extend through the base 11 of the temporary substrate 10. Further, the groove 3B has such a groove width that the second reflecting member 90 having a thickness that is half the width of the groove can reflect light from the light emitting element 20. The groove 3B is formed in such a manner that with regard to a grid size, one of the grids corresponds to a single light emitting device 100B having the first light emitting element 20A1 and the second light emitting element 20A2 when the light emitting devices are singulated at the position of the groove center as described later.

Next, filling step S111 of filling the groove with the second reflecting member is carried out in the first intermediate body providing step. In filling step S111 of filling the groove with the second reflecting member, the groove 3B formed is filled with the second reflecting member 90. By filling the groove 3B with the second reflecting member 90, a first intermediate body 101B is formed. The first intermediate body 101B forms a first lower surface 112B of which the lower surface is the lower surface of the base 11.

Next, as shown in FIG. 9G, a region extending from the first lower surface 112B side of the first intermediate body 101B to a part of the element electrodes 21 and 22 is removed by cutting or the like in the second intermediate body forming step. By cutting a region extending from the first lower surface 112B of the first intermediate body 101B to a predetermined part, the base 11 and the first wirings 12 and 13 are removed to obtain a second lower surface 113B, so that a second intermediate body 102B having the second lower surface 113B is formed. The second lower surface 113B of the second intermediate body 102B is formed in such a manner that the lower surface of the first reflecting member 30B, the lower surface of the solders 60, and the lower surfaces of the element electrodes 21 and 22 form the same flat surface.

Figure 9H:
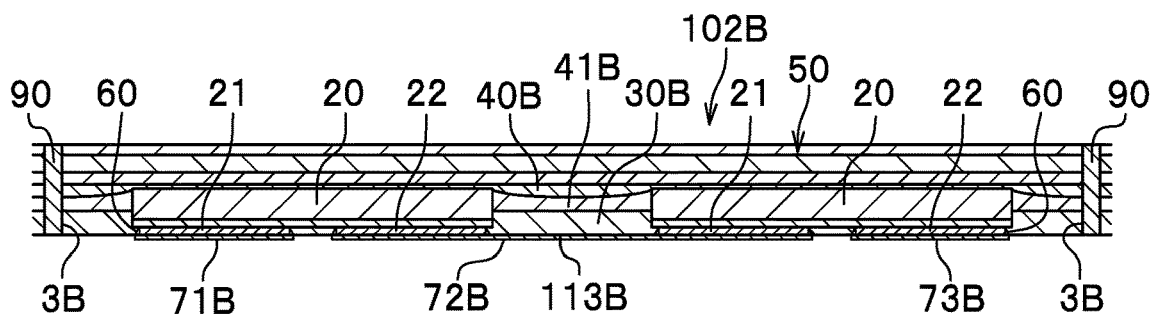
FIG. 9H is a diagram showing the method of manufacturing a light emitting device according to the third embodiment of the present disclosure, and is a cross-sectional view schematically showing a state in which external connection electrodes are formed on the second lower surface of the second intermediate body.

Next, as shown in FIG. 9H, the external connection electrodes 71B, 72B and 73B are formed on the second lower surface 113B of the second intermediate body 102B in the external connection electrode forming step. Here, the external connection electrodes 71B, 72B and 73B are formed by a method such as sputtering so as to be electrically connected to each of the first light emitting element 20A1 and the second light emitting element 20A2.

Preferably, the second lower surface 113B has a surface roughness larger than that of the lateral surface of the light emitting device and/or the upper surface of the light-transmissive member. This allows for increasing the bonding strength of the second lower surface 113B to the external connection electrodes 71B, 72B and 73B.

Next, in the singulating step, the second intermediate body 102B is singulated using a blade dicing method or a laser dicing method so as to obtain single light emitting devices 100B. In one example, two first light emitting elements 20A1 and second light emitting elements 20A2 form one light emitting device 100B. When the second intermediate body 102B is divided, the second intermediate body 102B can be divided so as to form rectangular solid-shaped light emitting devices 100B by cutting the second reflecting member 90 at the center thereof (center of groove 3B). The singulated light emitting devices 100B have an appearance in which the light-transmissive member 50B is disposed at the center as a light extraction surface, and the periphery of the light-transmissive member 50B is surrounded in a frame shape by the second reflecting member 90 as an outer lateral surface.

The light emitting device 100B is connected to the external connection electrodes 71B, 72B and 73B through the solder 60 and the element electrodes 21 and 22, and therefore the heat dissipation property of the light emitting device is improved. Further, in the light emitting device 100B, a plurality of light emitting elements can be used, and therefore color reproductivity can be improved.

In the light emitting device 100B, the first reflecting member 30B is positioned so as to cover the electrode-formation surface 203 of the light emitting element 20, so that light from the light emitting element 20 can be reflected to the light-transmissive member 50B side to enhance light extraction efficiency.

When the peak emission wavelengths of the first light emitting element 20A1 and the second light emitting element 20A2 in the light emitting device 100B are the same, light from the first light emitting element 20A1 and light from the second light emitting element 20A2 are guided to the second light guiding member 41B, so that luminance unevenness between the first light emitting element 20A1 and the second light emitting element 20A2 can be reduced. When the peak emission wavelengths of the first light emitting element 20A1 and the second light emitting element 20A2 are different from each other, light from the first light emitting element 20A1 and light from the second light emitting element 20A2 are guided to the second light guiding member 41B, so that the color mixing property of the light emitting device 100B can be improved. Further, the external connection electrode 72B positioned at the center of the second lower surface 113B serves as a heat dissipation portion, so that heat dissipation of the light emitting device 100B can be improved.

Fourth Embodiment

Figure 10:
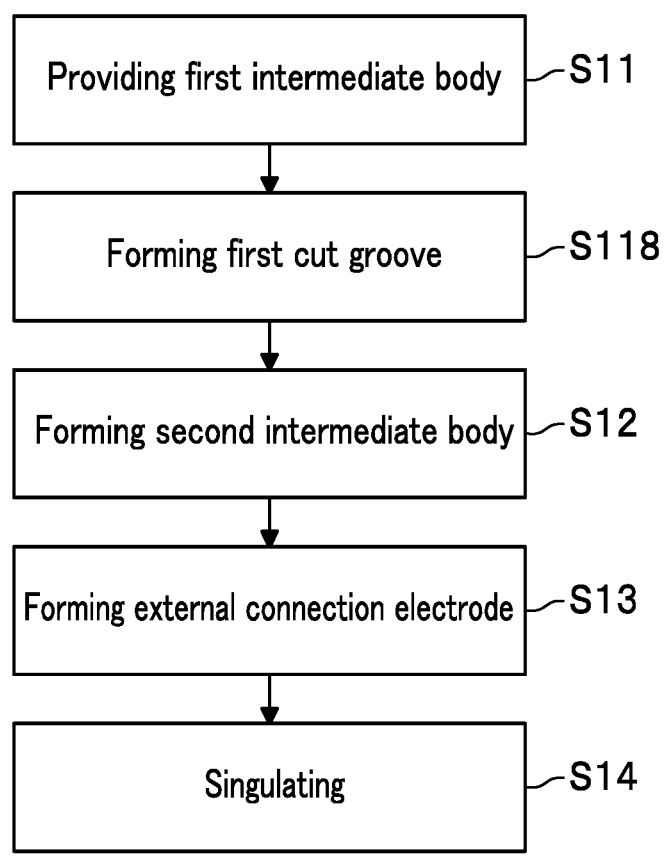
FIG. 10 is a flow chart illustrating a method of manufacturing a light emitting device according to a fourth embodiment of the present disclosure.
Figure 11A:
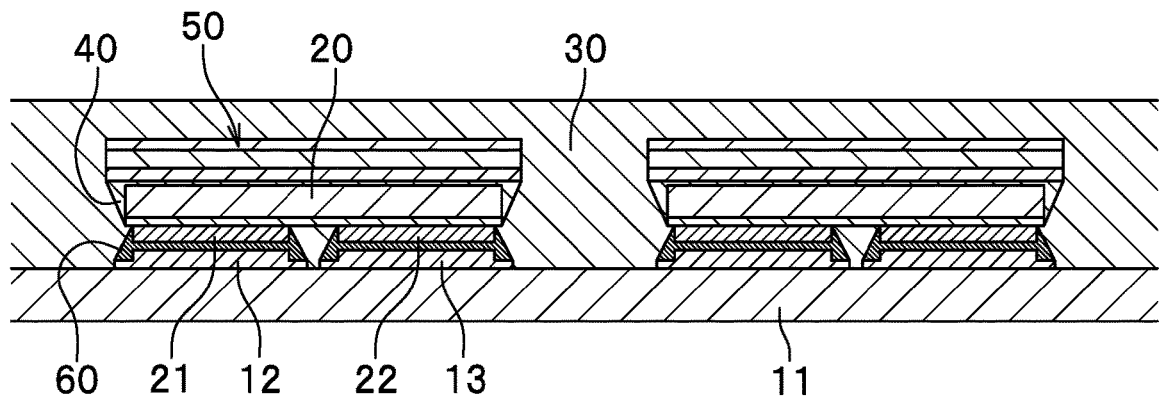
FIG. 11A is a diagram showing the method of manufacturing a light emitting device according to the fourth embodiment of the present disclosure, and is a cross-sectional view schematically showing a state in which a light emitting element is connected to a temporary substrate to provide a first light-reflective member.
Figure 11B:
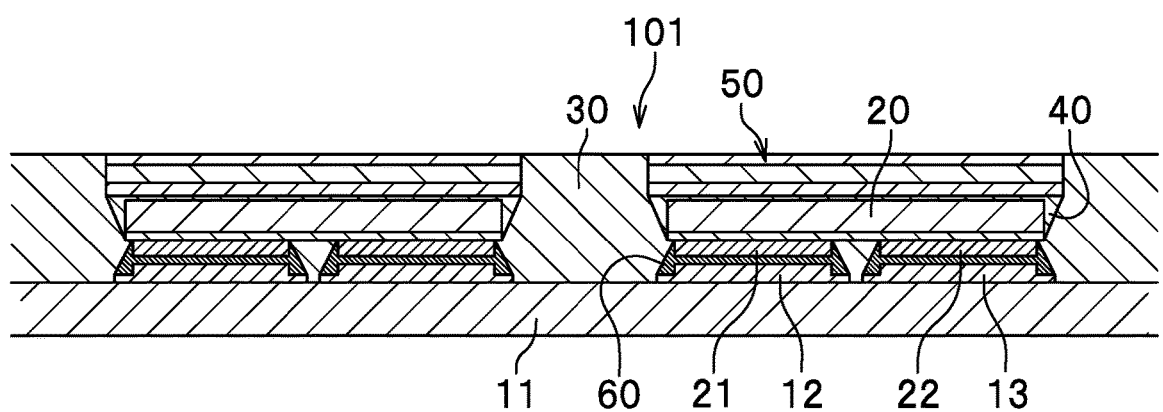
FIG. 11B is a diagram showing the method of manufacturing a light emitting device according to the fourth embodiment of the present disclosure, and is a cross-sectional view schematically showing a state in which an upper surface of a light transmissive member is exposed from the first reflective member to form a first intermediate body.
Figure 11C:
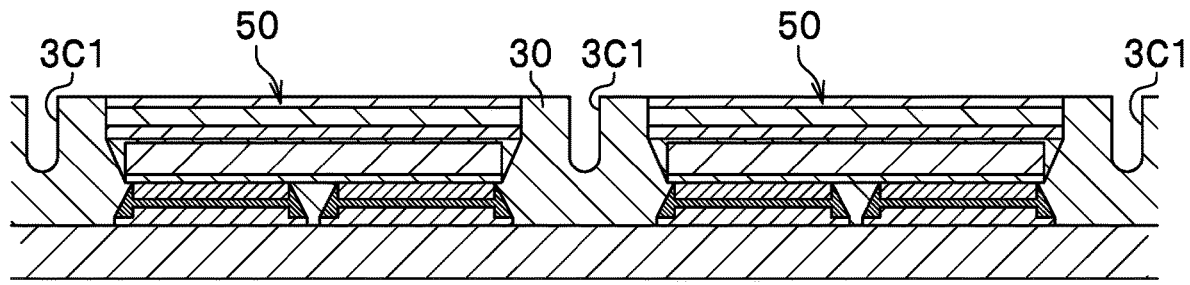
FIG. 11C is a diagram showing the method of manufacturing a light emitting device according to the fourth embodiment of the present disclosure, and is a cross-sectional view schematically showing a state in which a first cut groove is formed on un upper surface of the first reflecting member.
Figure 11D:
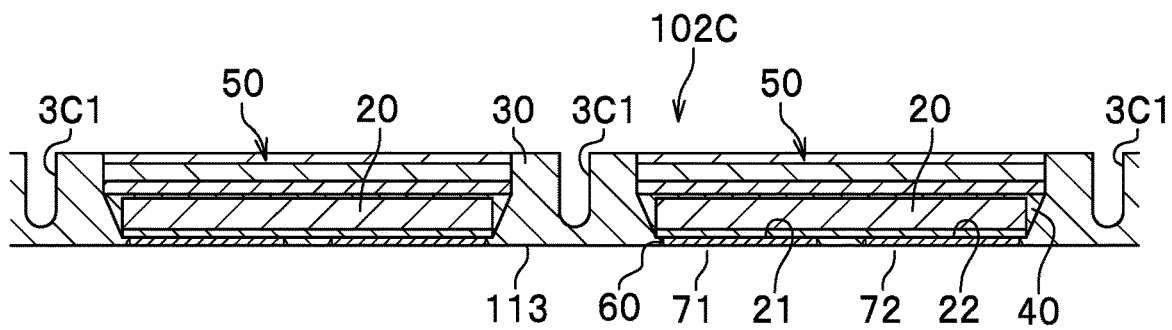
FIG. 11D is a diagram showing the method of manufacturing a light emitting device according to the fourth embodiment of the present disclosure, and is a cross-sectional view schematically showing a second intermediate body having a second lower surface formed by cutting a first lower surface of a first intermediate body.
Figure 11E:
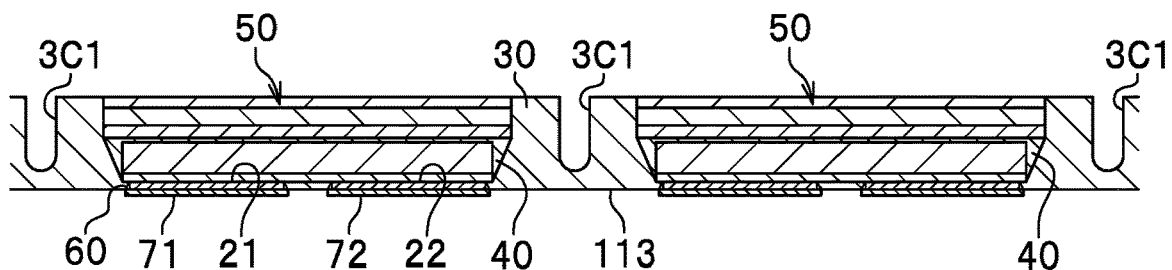
FIG. 11E is a diagram showing the method of manufacturing a light emitting device according to the fourth embodiment of the present disclosure, and is a cross-sectional view schematically showing a state in which external connection electrodes are formed on a second intermediate body.
Figure 11F:
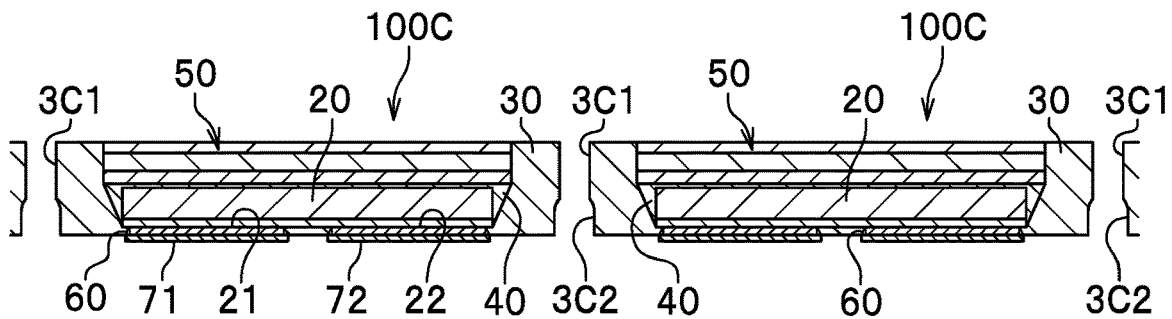
FIG. 11F is a diagram showing the method of manufacturing a light emitting device according to the fourth embodiment of the present disclosure, and is a cross-sectional view schematically showing light emitting devices singulated by forming a second cut groove on the second intermediate body.

Further, a light emitting device 100C may be manufactured by a manufacturing method as shown in FIGS. 10 and 11A to 11F. FIG. 10 is a flow chart illustrating a method of manufacturing a light emitting device according to a fourth embodiment. FIG. 11A is a diagram showing the method of manufacturing a light emitting device according to the fourth embodiment, and is a cross-sectional view schematically showing a state in which a light emitting element is connected to a temporary substrate to provide a first light-reflective member. FIG. 11B is a diagram showing the method of manufacturing a light emitting device according to the fourth embodiment, and is a cross-sectional view schematically showing a state in which an upper surface of a light-transmissive member is exposed from the first light-reflective member to form a first intermediate body. FIG. 11C is a diagram showing the method of manufacturing a light emitting device according to the fourth embodiment, and is a cross-sectional view schematically showing a state in which a first cut groove is formed in un upper surface of the first reflecting member. FIG. 11D is a diagram showing the method of manufacturing a light emitting device according to the fourth embodiment, where a second intermediate body with a second lower surface formed by cutting a first lower surface of the first intermediate body. FIG. 11E is a diagram showing the method of manufacturing a light emitting device according to the fourth embodiment, and is a cross-sectional view schematically showing a state in which external connection electrodes are formed on a second intermediate body. FIG. 11F is a diagram showing the method of manufacturing a light emitting device according to the fourth embodiment, and is a cross-sectional view schematically showing light emitting devices singulated by forming a second cut groove on the second intermediate body.

The method of manufacturing a light emitting device is carried out in accordance with a procedure including first intermediate body providing step S11, first cut groove forming step S118, second intermediate body forming step S12, external connection electrode forming step S13 and singulating step (second cut groove forming step) S14. In first intermediate body providing step S11, a first reflecting member 30 is supplied so as to cover the upper surface of a light-transmissive member 50, and cured as shown in, for example, FIG. 11A. Subsequently, the upper surface of the first reflecting member 30 and the upper surface of the light-transmissive member 50 are made to form the same flat surface by grinding the first reflecting member 30 so as to expose the upper surface of the light-transmissive member 50 as shown in FIG. 11B. In this manner, a first intermediate body 101 is prepared.

Subsequently, first cut groove forming step S118 is a step of forming a first cut groove 3C1 at intervals at which the first reflecting member 30 is divided as described later. In first cut groove forming step S118, the first cut groove 3C1 having a predetermined width and a predetermined depth is formed from the upper surface side of the first reflecting member 30 using a cutting tool such as a blade as shown in FIG. 11C. A part of the groove inner surface of the first cut groove 3C1, together with a second cut groove 3C2 as described later, forms the lateral surface of the first reflecting member 30 which forms the lateral surface of the light emitting device 100C when singulation is performed. In one example, it is desirable that the first cut groove 3C1 be formed with a groove depth or groove width which enables light emitting devices to be handled by a handler without separation of adjacent light emitting devices at the first reflecting member 30 in a subsequent step.

When the upper surface of a base has a mark to be used as a positioning reference for a light emitting element 20 and/or the light-transmissive member 50, the first cut groove 3C1 may be formed with reference to the mark. This allows for improving the position accuracy of the first cut groove 3C1 with respect to the light emitting element 20 and/or the light-transmissive member 50.

Second intermediate body forming step S12 and external connection electrode forming step S13 are the same steps as described above except that the first cut groove 3C1 is formed on a second intermediate body 102C. In singulating step S14, cutting is performed at the position of the first cut groove 3C1 to singulate light emitting devices 100C as shown in FIG. 11F. In singulating step S14, the second cut groove 3C2 opposed to the first cut groove 3C1 is formed from the lower surface side of the first reflecting member 30 by a cutting tool such as a blade to singulate light emitting devices 100C. The second cut groove 3C2 formed in singulating step S14 is formed so as to have a groove width larger than that of the first cut groove 3C1 and a groove depth smaller than that of the first cut groove 3C1 as one example. In singulating step S14, the second cut groove 3C2 is formed in addition to the first cut groove 3C1 formed beforehand, so that the portion of the first reflecting member 30 is cut to singulate light emitting devices 100C. In singulating step S14, the light emitting devices can be singulated by forming the second cut groove 3C2, and therefore the cutting time and the amount of cutting chips can be reduced as compared to a case where the whole of the first reflecting member 30 in a thickness direction is cut.

Fifth Embodiment

Figure 12:
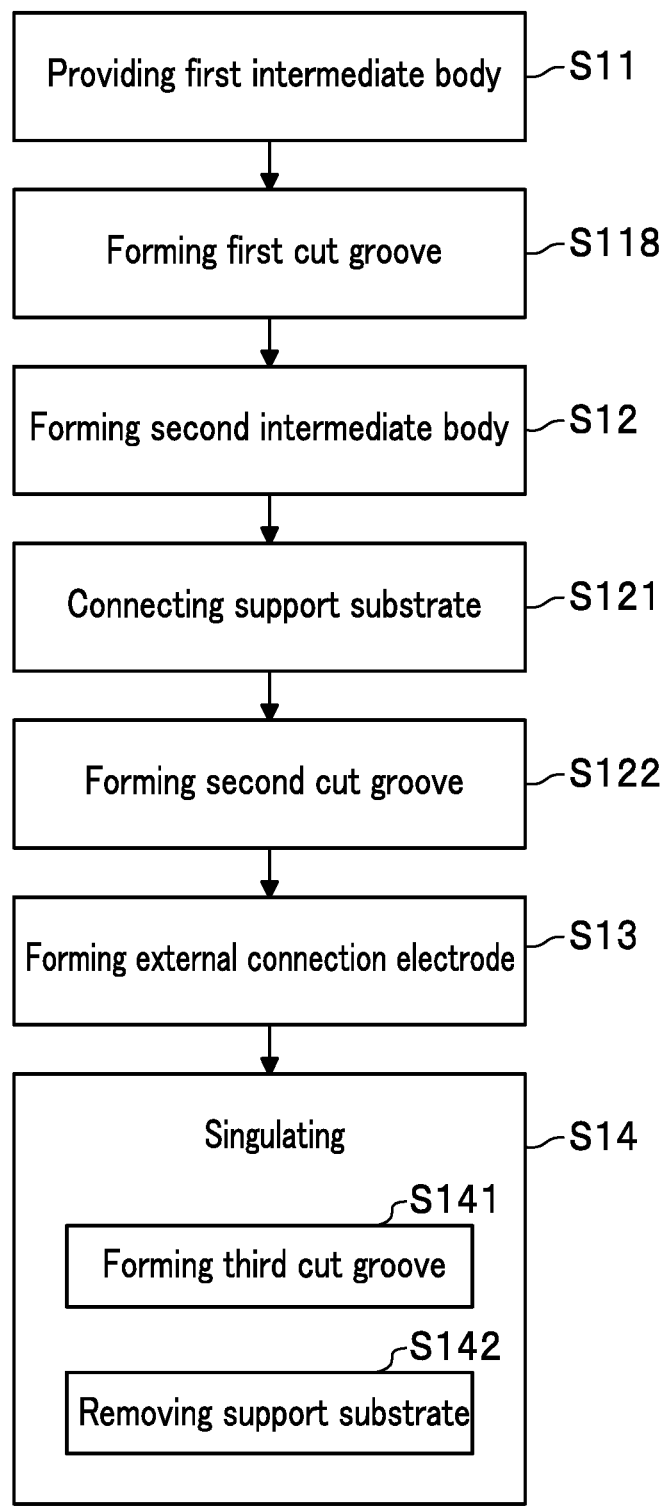
FIG. 12 is a flow chart illustrating a method of manufacturing a light emitting device according to a fifth embodiment of the present disclosure.
Figure 13A:
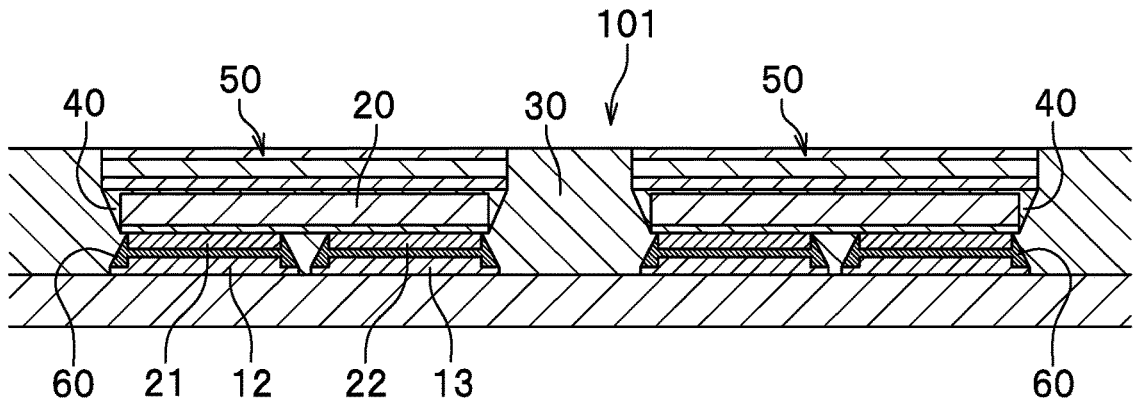
FIG. 13A is a diagram showing the method of manufacturing a light emitting device according to the fifth embodiment of the present disclosure, and is a cross-sectional view showing a state in which a first intermediate body is formed.
Figure 13B:
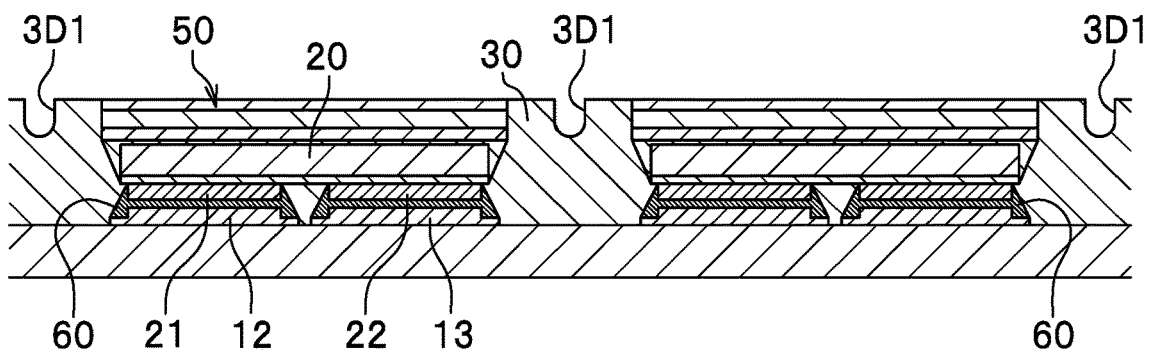
FIG. 13B is a diagram showing the method of manufacturing a light emitting device according to the fifth embodiment of the present disclosure, and is a cross-sectional view schematically showing a state in which a first cut groove is formed on an upper surface of a first reflecting member.
Figure 13C:
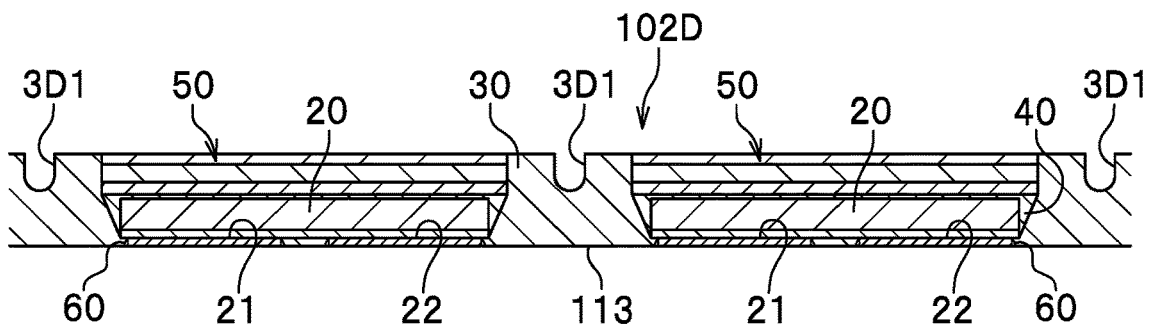
FIG. 13C is a diagram showing the method of manufacturing a light emitting device according to the fifth embodiment of the present disclosure, and is a cross-sectional view schematically showing a second intermediate body having a second lower surface formed by cutting a first lower surface of a first intermediate body.
Figure 13D:
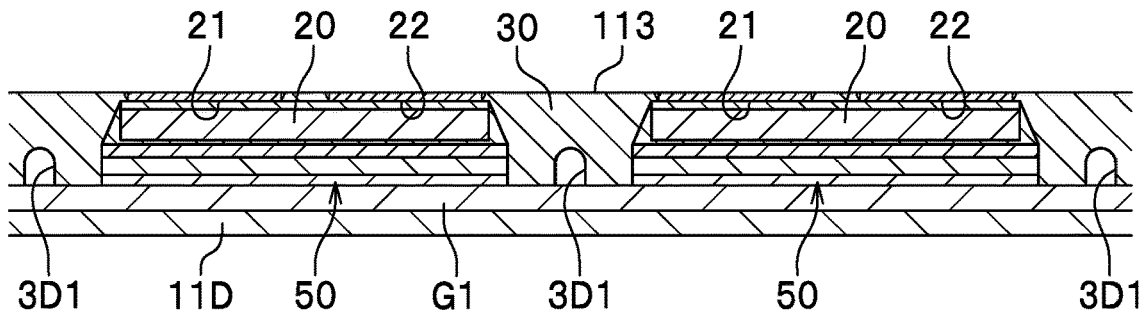
FIG. 13D is a diagram showing the method of manufacturing a light emitting device according to the fifth embodiment of the present disclosure, and is a cross-sectional view schematically showing a state in which an upper surface of the second intermediate body is supported on a support substrate.
Figure 13E:
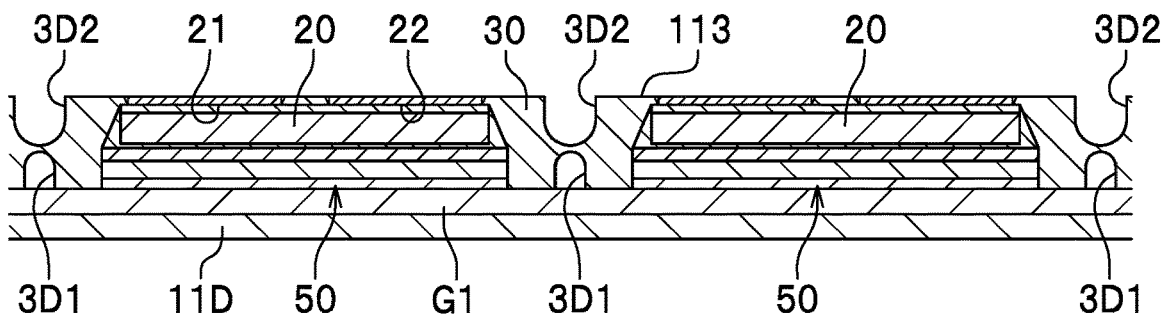
FIG. 13E is a diagram showing the method of manufacturing a light emitting device according to the fifth embodiment of the present disclosure, and is a cross-sectional view schematically showing a state in which a second cut groove is formed on a lower surface of the first reflecting member.
Figure 13F:
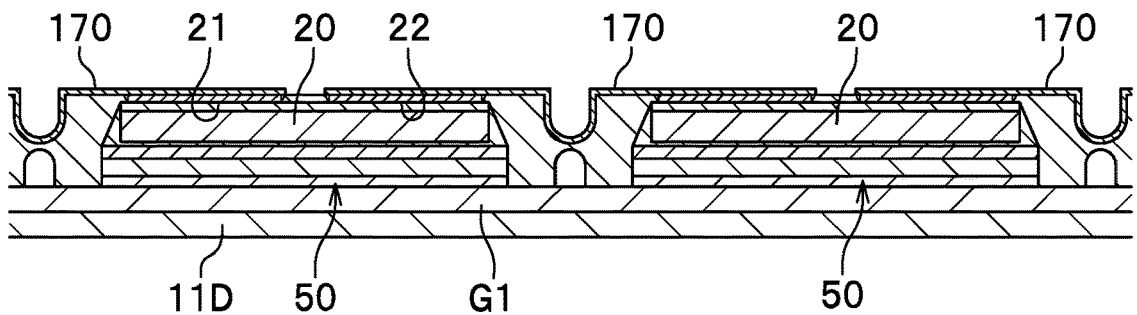
FIG. 13F is a diagram showing the method of manufacturing a light emitting device according to the fifth embodiment of the present disclosure, and is a cross-sectional view schematically showing a state in which a metal film is formed on a second lower surface of the second intermediate body and in the second cut groove.
Figure 13G:
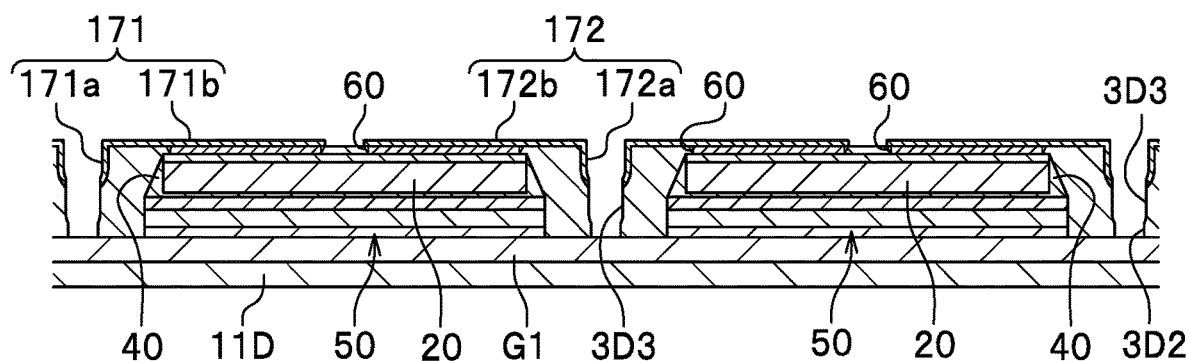
FIG. 13G is a diagram showing the method of manufacturing a light emitting device according to the fifth embodiment of the present disclosure, and is a cross-sectional view schematically showing a state in which a third cut groove is formed in a surface defining the second cut groove to cut the metal film, and lateral surface electrode portions and lower surface electrode portions are formed.
Figure 13H:
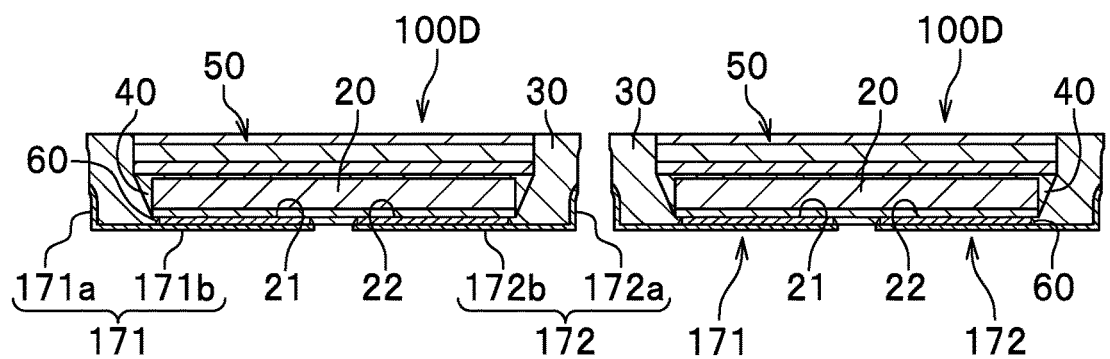
FIG. 13H is a diagram showing the method of manufacturing a light emitting device according to the fifth embodiment of the present disclosure, and is a cross-sectional view schematically showing a state in which the support substrate is removed to singulate light emitting devices.

Further, a light emitting device 100D may be manufactured by a manufacturing method as shown in FIGS. 12 and 13A to 13H. FIG. 12 is a flow chart illustrating a method of manufacturing a light emitting device according to a fifth embodiment. FIG. 13A is a diagram showing the method of manufacturing a light emitting device according to the fifth embodiment, and is a cross-sectional view schematically showing a state in which a first intermediate body is formed. FIG. 13B is a diagram showing the method of manufacturing a light emitting device according to the fifth embodiment, and is a cross-sectional view schematically showing a state in which a first cut groove is formed in an upper surface of a first reflecting member. FIG. 13C is a diagram showing the method of manufacturing a light emitting device according to the fifth embodiment, and is a cross-sectional view schematically showing a state a second intermediate body having a second lower surface formed by cutting a first lower surface of the first intermediate body. FIG. 13D is a diagram showing the method of manufacturing a light emitting device according to the fifth embodiment, and is a cross-sectional view schematically showing a state in which an upper surface of the second intermediate body is supported on a support substrate. FIG. 13E is a diagram showing the method of manufacturing a light emitting device according to the fifth embodiment, and is a cross-sectional view schematically showing a state in which a second cut groove is formed on a lower surface of the first reflecting member. FIG. 13F is a diagram showing the method of manufacturing a light emitting device according to the fifth embodiment, and is a cross-sectional view schematically showing a state in which a metal film is formed on a second lower surface of the second intermediate body and in the second cut groove. FIG. 13G is a diagram showing the method of manufacturing a light emitting device according to the fifth embodiment, and is a cross-sectional view schematically showing a state in which a third cut groove is formed in the second cut groove to cut the metal film, and a lateral surface electrode portion and a lower surface electrode portion are formed. FIG. 13H is a diagram showing the method of manufacturing a light emitting device according to the fifth embodiment, and is a cross-sectional view schematically showing a state in which the support substrate is removed to singulate light emitting devices.

The method of manufacturing a light emitting device is carried out in accordance with a procedure including first intermediate body providing step S11, first cut groove forming step S118, second intermediate body forming step S12, support substrate connecting step S121, second cut groove forming step S122, external connection electrode forming step S13 and singulating step S14. In singulating step S14, third cut groove forming step S141 and support substrate removing step S142 are carried out. Each of the external connection electrodes 171 and 172 may be disposed extending from a second lower surface 113 to cover at least a portion of corresponding lateral surfaces of a first reflecting member 30. The external connection electrodes 171 and 172 are the same as the external connection electrodes 71 and 72 described above except that lateral surface electrode portions 171a and 172a are provided.

In the method of manufacturing a light emitting device, first intermediate body providing step S11, first cut groove forming step S118 and second intermediate body forming step S12 are carried out in the same manner as the steps described above as shown in FIGS. 12 and 13A to 13C. Further, in second intermediate body forming step S12, a first cut groove 3D1 is formed so as to have a groove depth smaller than that of the first cut groove 3D1 described above. The first cut 3D1 is used at the time of singulating light emitting devices by a third cut groove 3D3 as described later, and is therefore able to reduce cutting chips and improve the processing rate in singulating although the groove depth is small.

Support substrate connecting step S121 is a step of supporting a second intermediate body 102D by applying the upper surface of the first reflecting member 30, on which the first cut groove 3D1 is formed, to a support substrate 11D. In support substrate connecting step S121, the second intermediate body 102D is supported on the support substrate 11D with, for example, an adhesive G1 for temporary bonding such as an ultraviolet curable resin. That is, the second intermediate body 102D is supported in a state of being temporarily bonded to the support substrate 11D with the adhesive G1 while a second lower surface 113 faces upward.

As shown in FIG. 13E, second cut groove forming step S122 is a step of forming a second cut groove 3D2 so as to be opposed to the first cut groove 3D1 from the second lower surface 113 of the second intermediate body supported on the support substrate 11D. In second cut groove forming step S122, the second cut groove 3D2 is formed so as to have a groove width larger than that of the first cut groove 3D1 and a groove depth equal to or larger than that of the first cut groove 3D1. The second cut groove 3D2 has a groove center substantially matched with the groove center of the first cut groove 3D1, and is separated from the groove bottom of the first cut groove 3D1. A part of the groove inner surface of the second cut groove 3D2, together with the above-described first cut groove 3D1 and the later-described third cut groove 3D3, forms the lateral surface of the light emitting device 100D (the lateral surface of the first reflecting member 30) when singulation is performed. The second cut groove 3D2 may be formed on at least one of the lateral surfaces of the light emitting device. For example, the light emitting device after singulation has a rectangular shape in a plan view, the second cut groove 3D2 may be positioned only on short sides, or only on long sides or on short sides and long sides of the outer edge of the light emitting device.

As shown in FIGS. 13F and 13G, external connection electrode forming step S13 is a step of forming external connection electrodes 171 and 172 on the second lower surface 113 and in the second cut groove 3D2. In external connection electrode forming step S13, for example, the external connection electrodes 171 and 172 may be provided by sputtering so as to be formed separately from each other and along element electrodes 21 and 22, respectively. In one example, a metal layer 170 continuous on the element electrodes 21 and 22 is formed, and at least a part of the metal layer 170 is then removed, so that the metal layer 170 connected to the element electrode 21 and the metal layer 170 connected to the element electrode 22 are separated from each other. Further, the metal layer 170 is formed in the second cut groove 3D2 by sputtering. One external connection electrode 171 may be cut by the third cut groove 3D3 in singulation as described below, and may be thus provided with a lateral surface electrode portion 171a formed on the lateral surface side of the first reflecting member 30 and a lower surface electrode portion 171b connected to the lateral surface electrode portion 171a and formed on one element electrode 21. Similarly, the other external connection electrode 172 may be cut by the third cut groove 3D3 in singulation as described below, and may be thus provided with a lateral surface electrode portion 172a formed on the lateral surface side of the first reflecting member 30 and a lower surface electrode portion 172b connected to the lateral surface electrode portion 172a and formed on the other element electrode 22.

The light emitting device after singulation is oblong in bottom view, the lateral surface electrode portion 172a may be positioned only on short sides, or only on long sides or on short sides and long sides of the outer edge of the light emitting device. The lateral surface electrode portion 172a and the lower surface electrode portion 172b may be in contact with each other, or separated from each other.

Singulating step S14 is a step of singulating light emitting devices 100D. In singulating step S14, third cut groove forming step S141 and support substrate removing step S142 are carried out.

In third cut groove forming step S141, the third cut groove 3D3 having a groove width smaller than the groove width of the second cut groove 3D2 and larger than the groove width of the first cut groove 3D1 is formed by a cutting tool such as a blade so as to cut a part of the metal layer 170 provided in the second cut groove 3D2 as shown in FIG. 13G. With the third cut groove 3D3 formed on the first reflecting member 30 in singulating step S14, the lateral surface electrode portion 172a can be formed inside the lateral surface of the first reflecting member 30 which is formed by the second cut groove 3D2 and the third cut groove 3D3.

As shown in FIG. 13H, support substrate removing step S142 is a step of removing the support substrate 11D of the first reflecting member 30 provided with the third cut groove 3D3. In support substrate removing step S142, as one example, an ultraviolet curable resin is used as the adhesive G1, and therefore by applying an ultraviolet ray, the light emitting devices 100D are separated from the adhesive G1, so that the support substrate 11D is removed to singulate the light emitting devices 100D.

In the light emitting device 100D formed by the manufacturing method described above, the lower surface electrode portions 171b and 172b formed on the second lower surface 113 and the lateral surface electrode portions 171a and 172a formed on the lateral surface of the first reflecting member 30 can be used as the external connection electrodes 171 and 172. Thus, in the light emitting device 100D, the range of types of external equipment to be connected through the external connection electrodes 171 and 172 can be expanded.

Figure 14A:
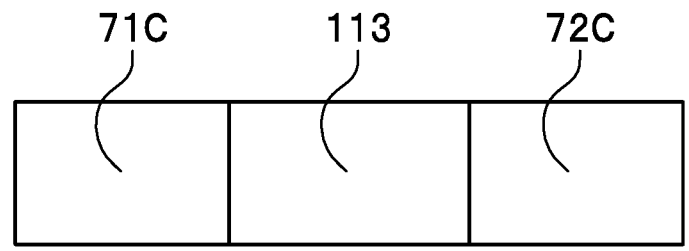
FIG. 14A is a bottom view schematically showing a first modified example of the external connection electrodes according to certain embodiments of the present disclosure.
Figure 14B:
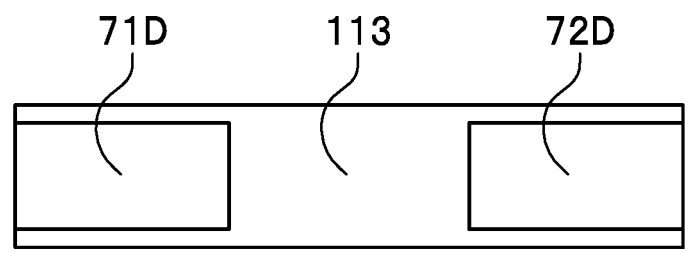
FIG. 14B is a bottom view schematically showing a second modified example of the external connection electrodes according to certain embodiments of the present disclosure.
Figure 14C:
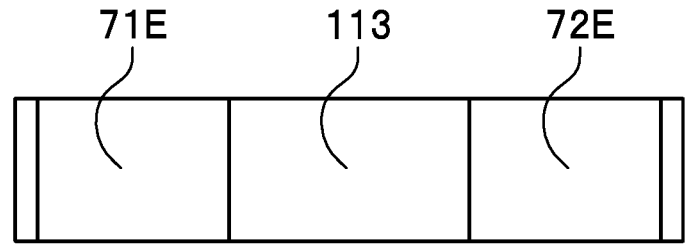
FIG. 14C is a bottom view schematically showing a third modified example of the external connection electrodes according to certain embodiments of the present disclosure.

In the embodiments described above, the external connection electrodes may be formed as shown in FIGS. 14A to 14C on the second lower surface 113 side.

That is, as shown in FIG. 14A, external connection electrodes 71C and 72C may be formed to be separated from each other and located at two opposite sides of the second lower surface 113, such that each of the external connection electrodes 71C and 72C is connected to the ends of the second lower surface 113 at both ends of each of the external connection electrodes 71C and 72C in the long direction and both ends of each of the external connection electrodes 71C and 72C in the short direction.

Alternatively, as shown in FIG. 14B, external connection electrodes 71D and 72D may be formed such that both ends of each of the external connection electrodes 71D and 72D in the long direction thereof is connected to corresponding ends of the second lower surface 113 and both ends of each of the external connection electrodes 71D and 72D in the short direction thereof is separated from corresponding ends of the second lower surface 113. The external connection electrodes 71D and 72D may be formed such that both ends of each of the external connection electrodes 71D and 72D in the long direction thereof is connected to corresponding ends of the second lower surface 113 and one end of each of the external connection electrodes 71D and 72D in the short direction thereof is connected to corresponding ends of the second lower surface 113 while the other end of each of the external connection electrodes 71D and 72D in the short direction thereof is separated from corresponding ends of the second lower surface 113.

Further, as shown in FIG. 14C, external connection electrodes 71E and 72E may be formed to be connected to the ends of the second lower surface 113 at both ends of each of external connection electrodes 71E and 72E in the short direction, and separated from the ends at both ends of each of external connection electrodes 71E and 72E in the long direction.

The external connection electrodes described in FIGS. 14A, 14B and 14C may be formed together with the above-described lateral surface electrode portions on the lateral surface of the first reflecting member 30. For example, the light emitting device is oblong in bottom view, the lateral surface electrode portions may be positioned only on the short sides, only on the long sides and on short sides and long sides of the outer edge of the light emitting device. The lateral surface electrode portion and the lower surface electrode portion may be in contact with each other, or separated from each other.

Further, first wirings may have a configuration as shown in FIGS. 15A to 15D.

Figure 15A:
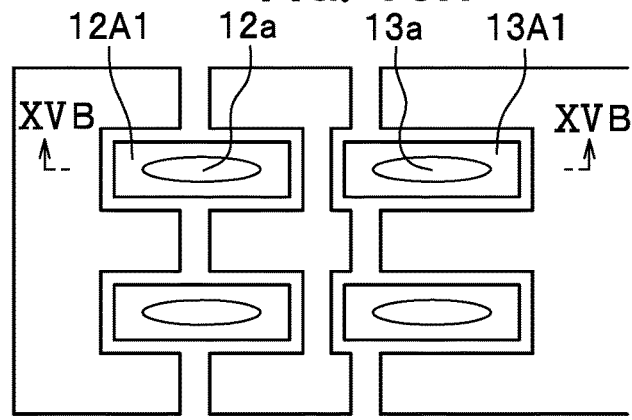
FIG. 15A is a plan view schematically showing a first modified example of a first wiring of the temporary substrate according to certain embodiments of the present disclosure.
Figure 15B:
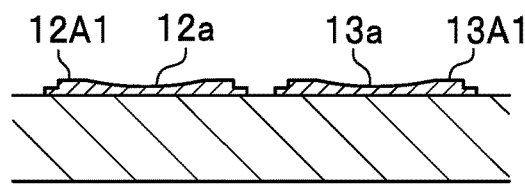
FIG. 15B is a schematic cross-sectional view taken along line XVB-XVB in FIG. 15A.

That is, as shown in FIGS. 15A and 15B, first wirings 12A1 and 13A1 have projections, and the upper surfaces of the projections may have depressions 12a and 13a. When the depressions 12a and 13a are formed on the projections of the first wirings 12A1 and 13A1, an adjustment can be made by allowing excess solder 60 to enter the depressions 12a and 13a if the amount of the solder 60 for bonding the wirings to the element electrodes 21 and 22 of the light emitting element 20 is large.

Figure 15C:
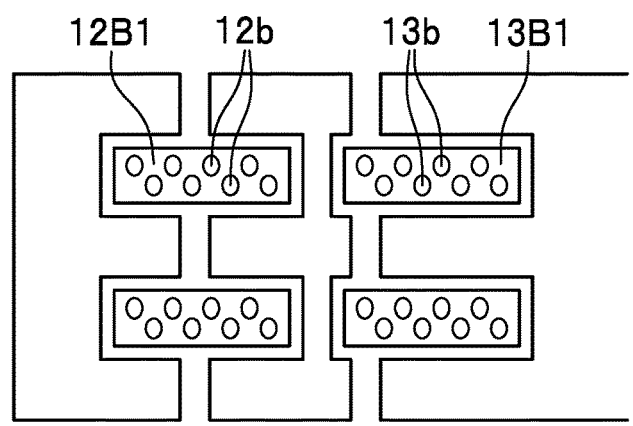
FIG. 15C is a plan view schematically showing a second modified example of the first wiring of the temporary substrate according to certain embodiments of the present disclosure.

Further, with regard to the shape and the number of depressions, a plurality of substantially circular depressions 12b and 13b may be formed on first wirings 12B1 and 13B1 as shown in FIG. 15C.

Figure 15D:
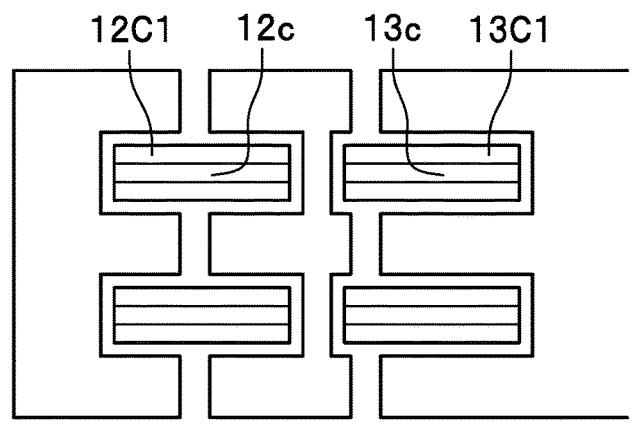
FIG. 15D is a plan view schematically showing a third modified example of the first wiring of the temporary substrate according to certain embodiments of the present disclosure.

With regard to the shape of depressions, depressions 12c and 13c may be continued from one end to the other at the centers of first wirings 12C1 and 13C1, respectively, as shown in FIG. 15D.

The depressions 12a to 12c and 13a to 13c are capable of making an adjustment by allowing excess solder 60 to enter inside. The depression may have any appropriate shape in top view, and may have, for example, a circular shape, an elliptic shape or a polygonal shape.

In the embodiments described above, the temporary substrate 10 may have a planar shape in which the first wirings 12 and 13 do not have projections at positions opposed to the element electrodes 21 and 22 of the light emitting element 20. For the first wirings 12 and 13 to have a planar shape, it is preferable that the first wirings 12 and 13 are each formed so as to have an area larger than each of the element electrodes 21 and 22.

When the second light guiding member 41B and the first reflecting member 30B are formed by settling a reflecting member such as a white pigment of the first reflecting member 30B in the third embodiment, the number of procedures can be reduced in the manufacturing method, and necessity to providing the second light guiding member 41B separately can be eliminated to simplify equipment.

Further, it is preferable that the light emitting device 100 has a structure which allows for identifying the polarity according to appearance. With such a structure, when the light emitting devices 100 are to be stored in a desired direction in a carrier tape, and conveyed, or when the light emitting devices 100 are mounted in a desired direction on a mounting substrate, the direction of arrangement of the light emitting devices can be easily determined.

Figure 16A:
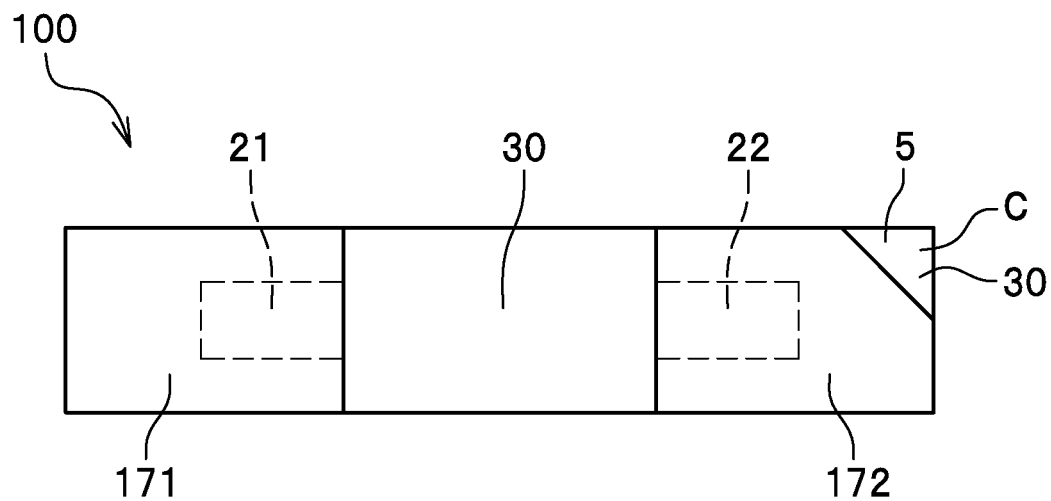
FIG. 16A is a bottom view schematically showing a first modified example of the light emitting device according to certain embodiments of the present disclosure.
Figure 16B:
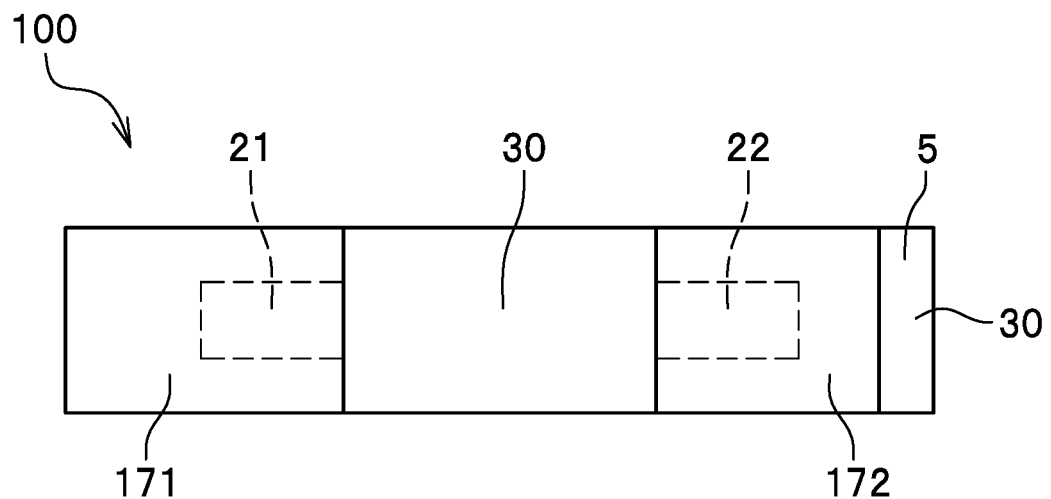
FIG. 16B is a bottom view schematically showing a second modified example of the light emitting device according to certain embodiments of the present disclosure.
Figure 16C:
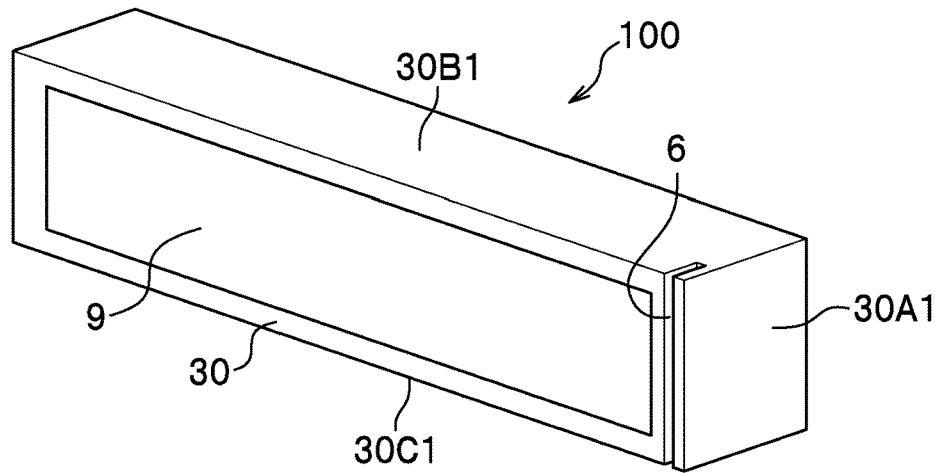
FIG. 16C is a bottom view schematically showing a third modified example of the light emitting device according to certain embodiments of the present disclosure.
Figure 16D:
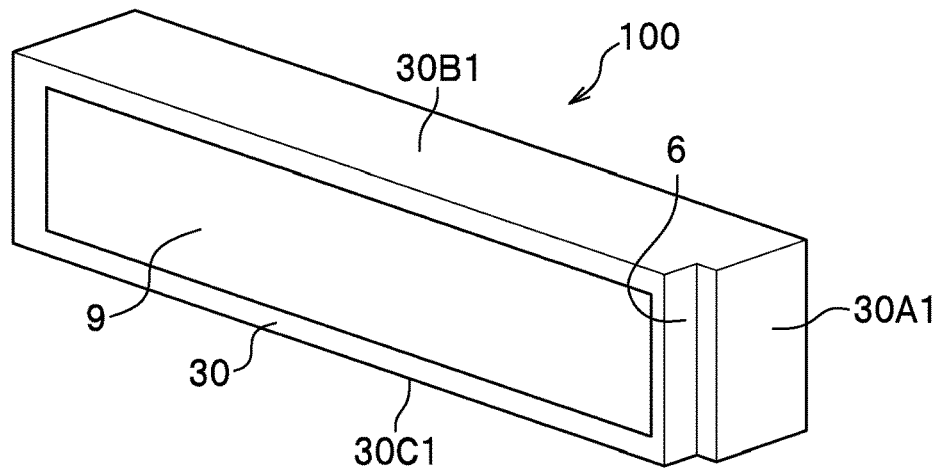
FIG. 16D is a bottom view schematically showing a fourth modified example of the light emitting device according to certain embodiments of the present disclosure.
Figure 16E:
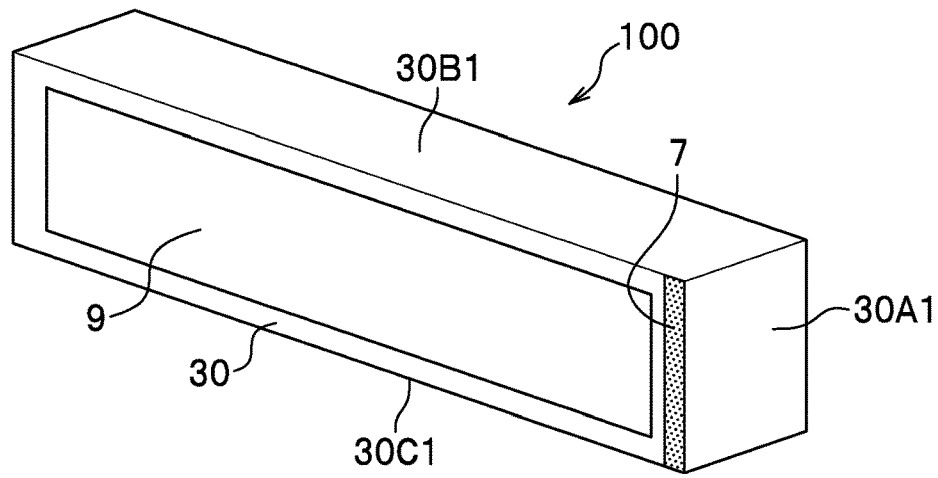
FIG. 16E is a bottom view schematically showing a fifth modified example of the light emitting device according to certain embodiments of the present disclosure.

Examples of a structure that allows identification in polarity are shown in FIGS. 16A to 16E. FIGS. 16A and 16B are bottom views schematically showing first and second modified examples of the light emitting device in the embodiments. FIGS. 16C to 16E are perspective views schematically showing third to fifth modified examples of the light emitting devices in the embodiments.

As shown in FIGS. 16A and 16B, the planar shapes of the external connection electrodes 171 and 172 are made different from each other, whereby the polarity can be determined. For example, in FIG. 16A, a non-electrode-formed region 5 is provided at a corner portion C of one external connection electrode 172 among the rectangular external connection electrodes 171 and 172 to make the planar shapes of the external connection electrodes 171 and 172 different from each other. In a region provided with the non-electrode-formed region 5, the first reflecting member 30 is exposed. In FIG. 16A, the non-electrode-formed region 5 is present at the corner portion C, but the non-electrode-formed region 5 may be provided at another corner portion, or the non-electrode-formed region 5 may be present at two or more corner portions.

In FIG. 16B, the non-electrode-formed region 5 having, for example, a rectangular shape, at an end surface of the external connection electrode 172 such that the non-electrode-formed region 5 extends across a pair of opposite sides of the external connection electrode 172, so that the planar shapes and the sizes of the external connection electrodes 171 and 172 is different from each other. In the non-electrode-formed region 5, the first reflecting member 30 is exposed. Accordingly, with the non-electrode-formed region 5, the external connection electrodes 171 and 172 are different from each other in color and material, so that the external connection electrodes 171 and 172 can be identified visually and texturally, which can facilitate determining direction of the light emitting device.

Further, the non-electrode-formed region 5 can be formed by, for example, the laser light irradiation described above. Specifically, in external connection electrode forming step S13, a metal layer is formed over the entirety of the second lower surface 113 so as to continuously cover the element electrodes 21 and 22 and the first reflecting member 30 positioned on the second lower surface 113, the metal layer is irradiated with laser light to form the external connection electrodes 171 and 172, and a part of the metal layer positioned in the non-electrode-formed region 5 is removed. When laser light irradiation is performed, the need to use a mask or the like may be eliminated to simplify the process. The non-electrode-formed region 5 may be formed by a known method such as etching or blast as well as laser light irradiation.

It is preferable that as shown in FIGS. 16A and 16B, the non-electrode-formed region 5 of the external connection electrode is provided in such a manner that the element electrodes 21 and 22 of the light emitting element 20 is not exposed to outside. For example, when the external connection electrodes 171 and 172 and the non-electrode-formed region 5 are formed by performing laser irradiation, the non-electrode-formed region 5 can be easily formed in the above-mentioned manner by performing laser irradiation under such conditions that the metal layer positioned on the element electrodes 21 and 22 is not subjected to laser abrasion. Accordingly, for example, even when the element electrodes 21 and 22 of the light emitting element 20 are composed of an easily oxidizable material such as copper, oxidation or the like of the element electrodes 21 and 22 can be reduced because the element electrodes 21 and 22 are not exposed to outside.

In FIGS. 16A and 16B, the only the external connection electrode 172 is provided with the non-electrode-formed region 5, but both the external connection electrodes 171 and 172 may be provided with the non-electrode-formed region 5 to have different planar shapes.

Further, as shown in FIGS. 16C and 16D, the first reflecting member 30 positioned on the light emitting surface side of the light emitting device 100 is provided with a non-through groove 6 to determine the polarity of the light emitting device 100. The groove 6 shown in FIG. 16C is separated from an outer lateral surface 30A1 of the light emitting device 100, and extends to a pair of opposite outer lateral surfaces 30B1 and 30C1. In FIG. 16C, the polarity of the light emitting device 100 can be easily determined according to the presence of the groove 6. Further, with the groove 6 separated from the outer lateral surface 30A1 of the light emitting device 100, reduction of the thickness of the first reflecting member 30 positioned between a light emitting surface 9 and the outer lateral surface 30A1 can be prevented, so that light from the light emitting element 20 can be inhibited from being leaked to outside from the first reflecting member 30 positioned in the region. It can also be said that the groove 6 shown in FIG. 16C is formed as a step of singulating the light emitting devices 100.

Further, the groove 6 shown in FIG. 16D is different from the groove 6 shown in FIG. 16C in that the groove 6 shown in FIG. 16D extends not only to a pair of opposite outer lateral surfaces 30B1 and 30C1 but also to the outer lateral surface 30A1. With the groove 6 extending not only to a pair of opposite outer lateral surfaces 30B1 and 30C1 but also to the outer lateral surface 30A1, the polarity of the light emitting device 100 can be determined from the outer lateral surface 30A1 side.

The groove 6 shown in each of FIGS. 16C and 16D extends to a pair of opposite outer lateral surfaces 30B1 and 30C1, but the present disclosure is not limited thereto. The groove 6 may extend to one lateral surface of a pair of outer lateral surfaces 30B1 and 30C1, or may be separated from a pair of outer lateral surfaces 30B1 and 30C1. Further, the groove 6 can be formed by, for example, a laser or dicing.

Further, in FIG. 16E, the first reflecting member 30 positioned on the light emitting surface side of the light emitting device 100 is provided with a coloring material 7 to determine the polarity of the light emitting device 100. By providing the coloring material 7 on the light emitting surface side of the light emitting device 100, the polarity of the light emitting device 100 is easily determined from the light emitting surface side. Further, without the groove 6 or the like on the first reflecting member 30, reduction of the intensity of the light emitting device 100 can be prevented.

Figure 17A:
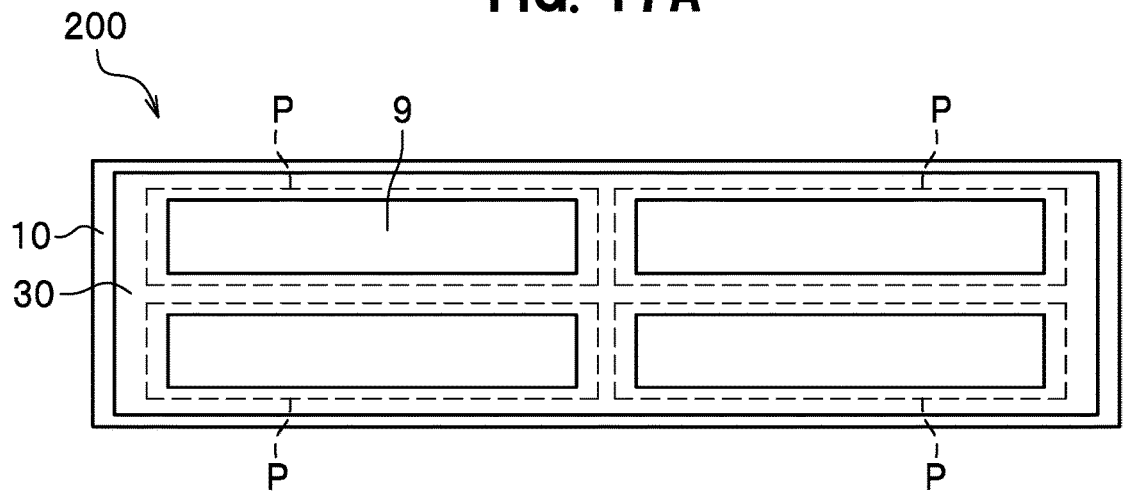
FIG. 17A is a diagram schematically showing one example of a method of forming a groove according to certain embodiments of the present disclosure.
Figure 17B:
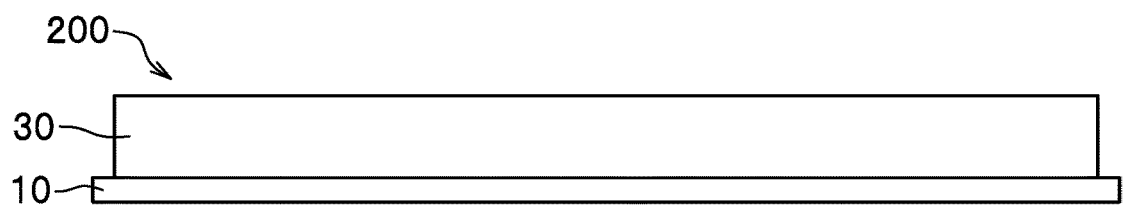
FIG. 17B is a diagram schematically showing a lateral surface state in FIG. 17A.
Figure 17C:
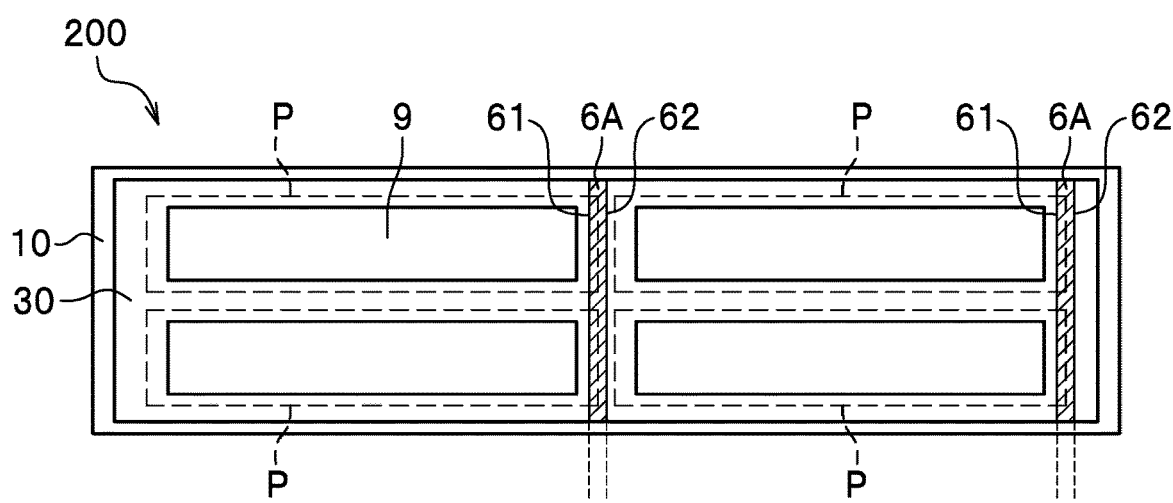
FIG. 17C is a diagram schematically showing a state in which a groove is formed on the first intermediate body according to certain embodiments of the present disclosure.
Figure 17D:
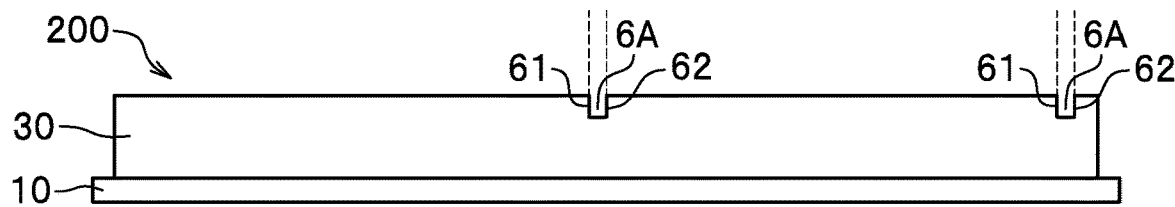
FIG. 17D is a diagram schematically showing a state in which a groove is formed in a side view of the first intermediate body in FIG. 17C.
Figure 17E:
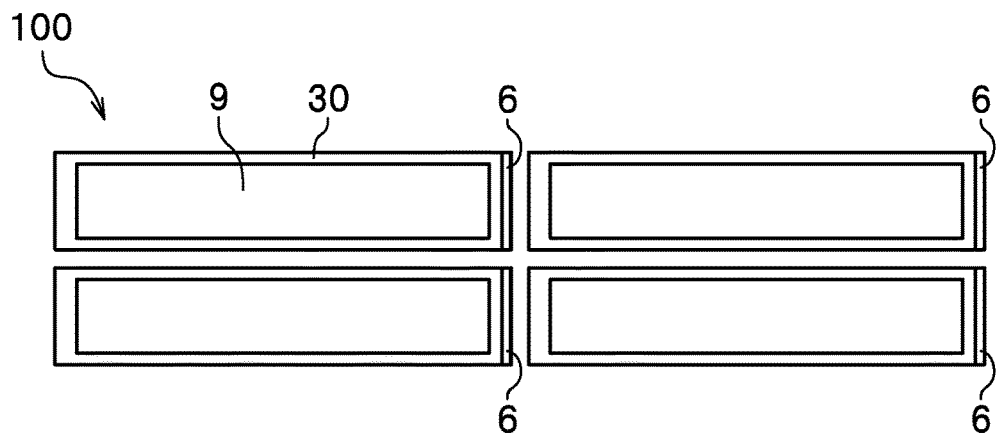
FIG. 17E is a plan view schematically showing a state in which light emitting devices provided with a groove are singulated according to certain embodiments of the present disclosure.
Figure 17F:
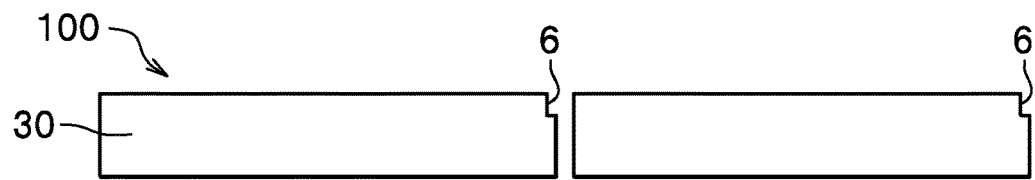
FIG. 17F is a side view schematically showing a state in which light emitting devices provided with a groove are singulated according to certain embodiments of the present disclosure.
Figure 17G:
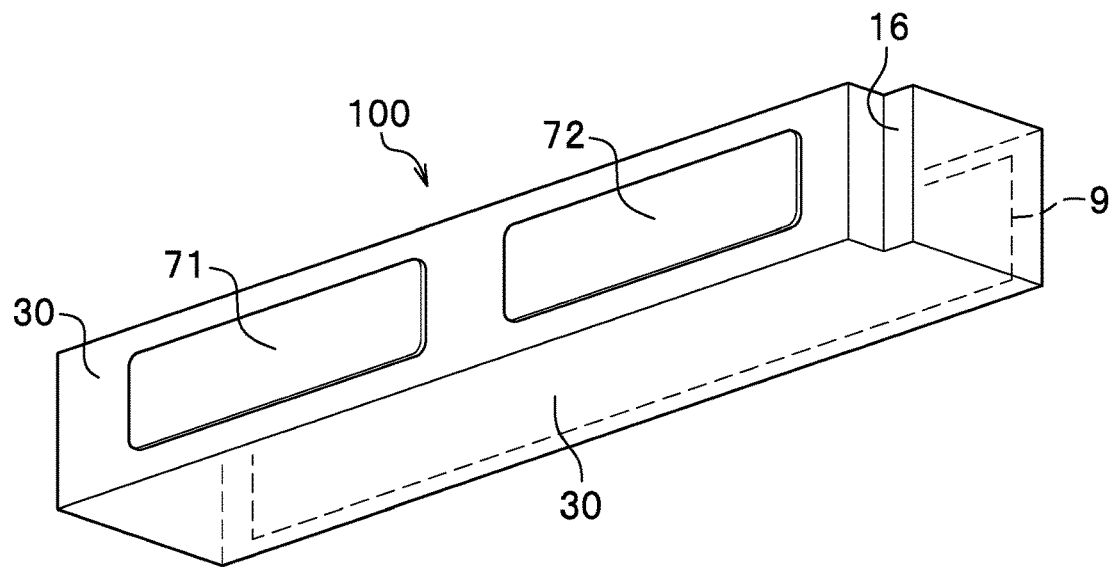
FIG. 17G is a perspective view schematically showing a modified example in which a groove is formed at the bottom surface side of the light emitting device according to certain embodiments of the present disclosure.

One example of a method of forming the groove 6 shown in FIG. 16D will now be described with reference to FIGS. 17A to 17G. FIG. 17A is a diagram schematically showing one example of a method of forming a groove in certain embodiments. FIG. 17B is a diagram schematically showing a lateral surface state in FIG. 17A. FIG. 17C is a diagram schematically showing a state in which a groove is formed on the first intermediate body in certain embodiments. FIG. 17D is a diagram schematically showing a state in which a groove is formed in side view of the first intermediate body in FIG. 17C. FIG. 17E is a plan view schematically showing a state in which light emitting devices provided with a groove are singulated in certain embodiments. FIG. 17F is a side view schematically showing a state in which light emitting devices provided with a groove are singulated in certain embodiments. FIG. 17G is a perspective view schematically showing a modified example in which a groove is formed on the bottom surface side of the light emitting device in certain embodiments.

First, a structure 200 is prepared in which regions P that is turned into the light emitting devices 100 after singulation (hereinafter, referred to simply as light emitting device forming regions P) are arranged in rows and columns as shown in FIG. 17A. In FIGS. 17A and 17C, the light emitting device forming regions P are indicated by a broken line, and FIGS. 17A to 17E show an example in which four light emitting device forming regions P are present. As shown in FIGS. 17A and 17B, the structure 200 which is a first intermediate body has the temporary substrate 10 on the lower surface side, and the light emitting device forming regions P on the upper surface side. On the light emitting surface side of the structure 200, the light emitting surface 9 positioned in the light emitting device forming regions P is exposed from the first reflecting member 30. The light emitting surface 9 of the structure 200 is a substantially flat surface, and each light emitting surface 9 and the upper surface of the first reflecting member 30 are positioned on substantially the same flat surface.

Next, a groove 6A is formed on the first reflecting member 30 positioned between the light emitting surfaces 9 adjacent to each other in the long direction as shown in FIGS. 17C and 17D. In FIG. 17C, a region where the groove 6A is formed is hatched. A part of the groove 6A remains in the light emitting device 100 after singulation, and serves as the groove 6 which makes it possible to determine the polarity of the light emitting device 100. For example, the groove 6A is formed in such a manner that in top view, a first side 61 in a direction along which the groove 6A extends is disposed inside the light emitting device forming region P, and a second side 62 is disposed outside the adjacent light emitting device forming region P. Accordingly, in the light emitting device 100 after singulation, the groove 6 is formed only on the outer lateral surface of a pair of opposite outer lateral surfaces of the light emitting device 100, so that the polarity of the light emitting device 100 is easily determined by the groove 6. The groove 6A can be formed by, for example, a laser or dicing.

As shown in FIGS. 17E and 17F, the structure 200 is divided into the light emitting devices 100 after the temporary substrate 10 is removed. Each light emitting device 100 has the groove 6 on the light emitting surface side, and the polarity of the light emitting device 100 can be determined. Accordingly, when the light emitting devices 100 are to be stored in a desired direction in a carrier tape, and conveyed, or when the light emitting devices 100 are mounted in a desired direction on a mounting substrate, the direction of arrangement of the light emitting devices can be easily discriminated.

The groove 6 shown in FIG. 17F is provided on the first reflecting member 30 positioned on the upper surface side of the light emitting device 100, but the light emitting device of the present disclosure is not limited thereto. For example, as shown in FIG. 17G, a groove 16 may be provided on the first reflecting member 30 positioned on the lower surface side of the light emitting device 100.

Figure 18:
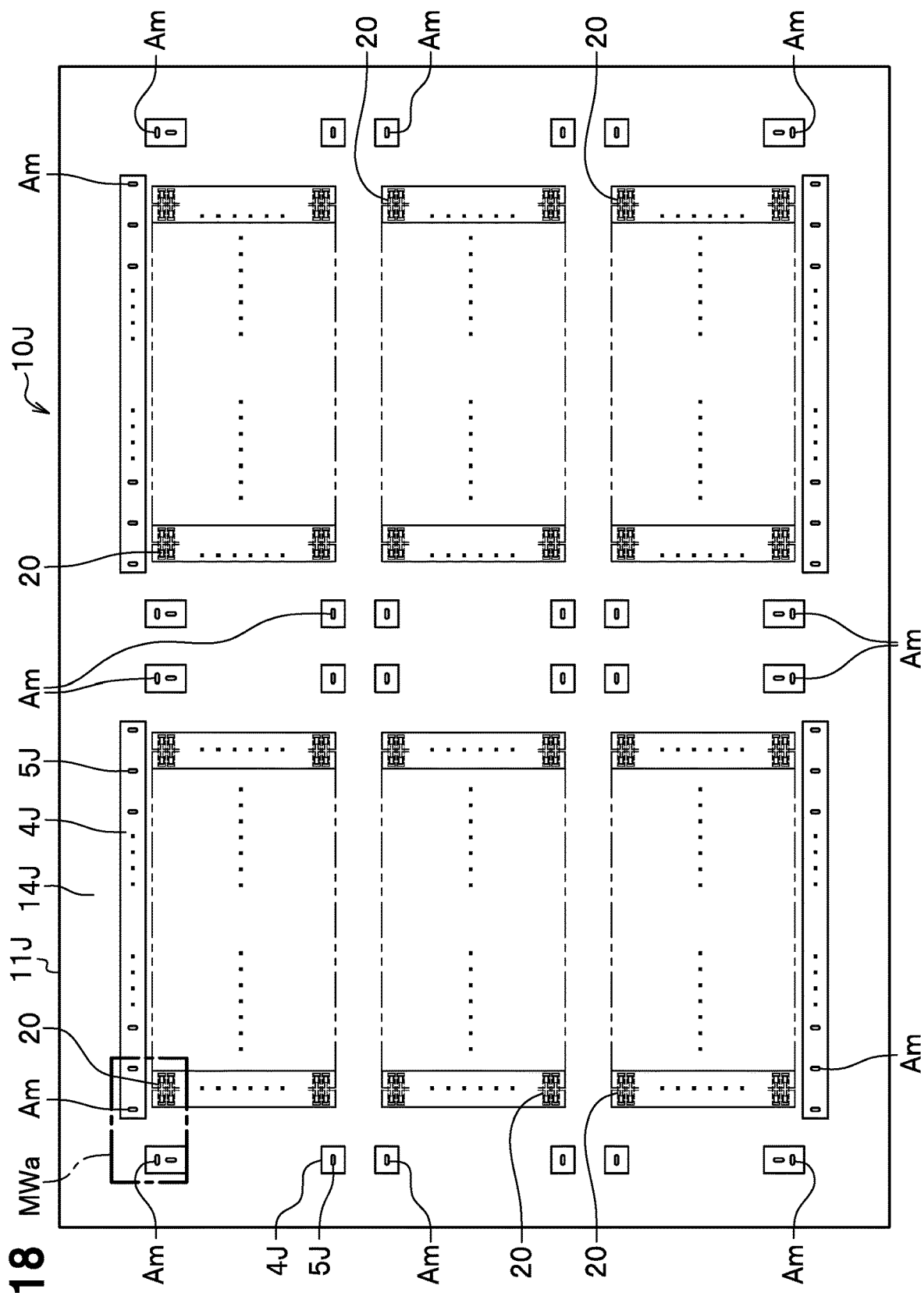
FIG. 18 is a plan view schematically showing the temporary substrate of the light emitting device according to certain embodiments of the present disclosure.
Figure 19:
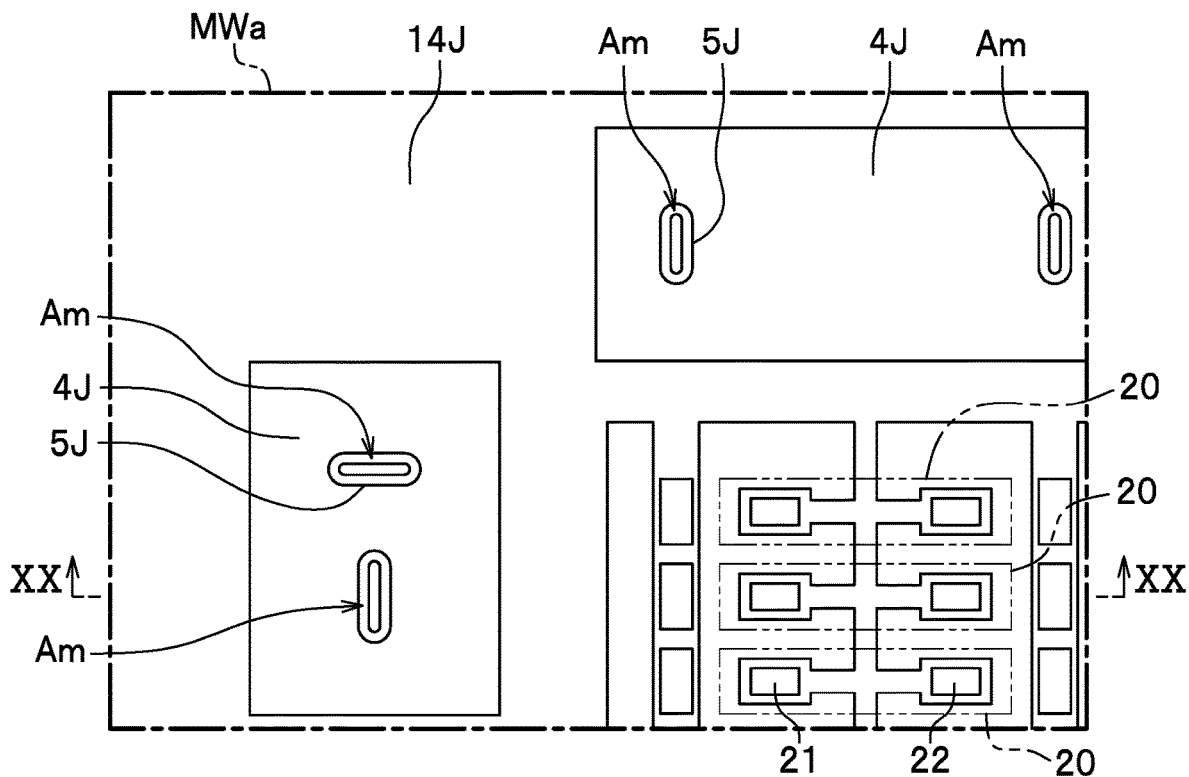
FIG. 19 is an enlarged plan view schematically showing a region WMa surrounded by a dot-and-dash line in FIG. 18.
Figure 20:
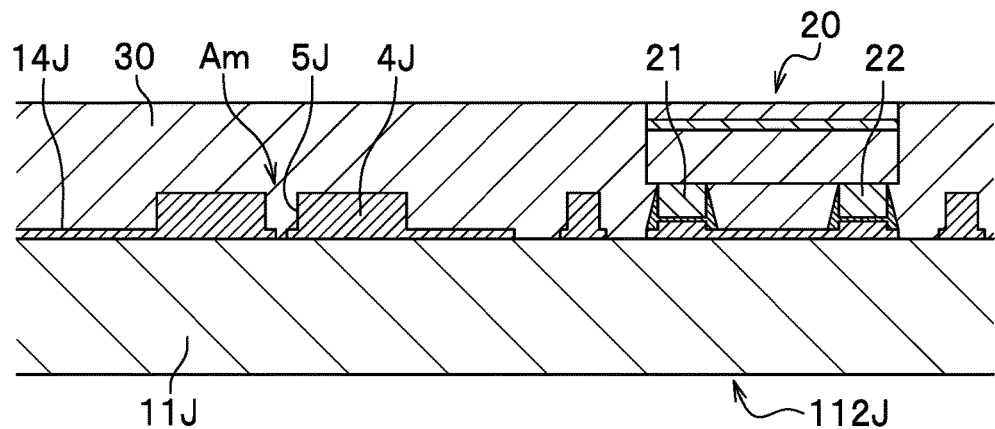
FIG. 20 is a schematic cross-sectional view taken along line XX-XX in FIG. 19.
Figure 21:
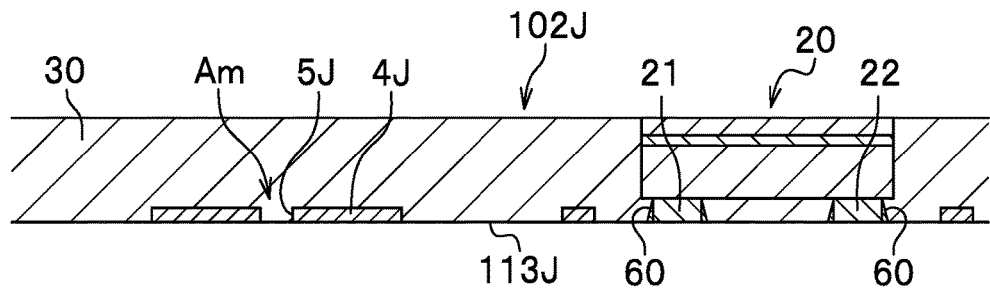
FIG. 21 is a cross-sectional view schematically showing a second intermediate body having a second lower surface formed by cutting a first lower surface of a first intermediate body.
Figure 22:
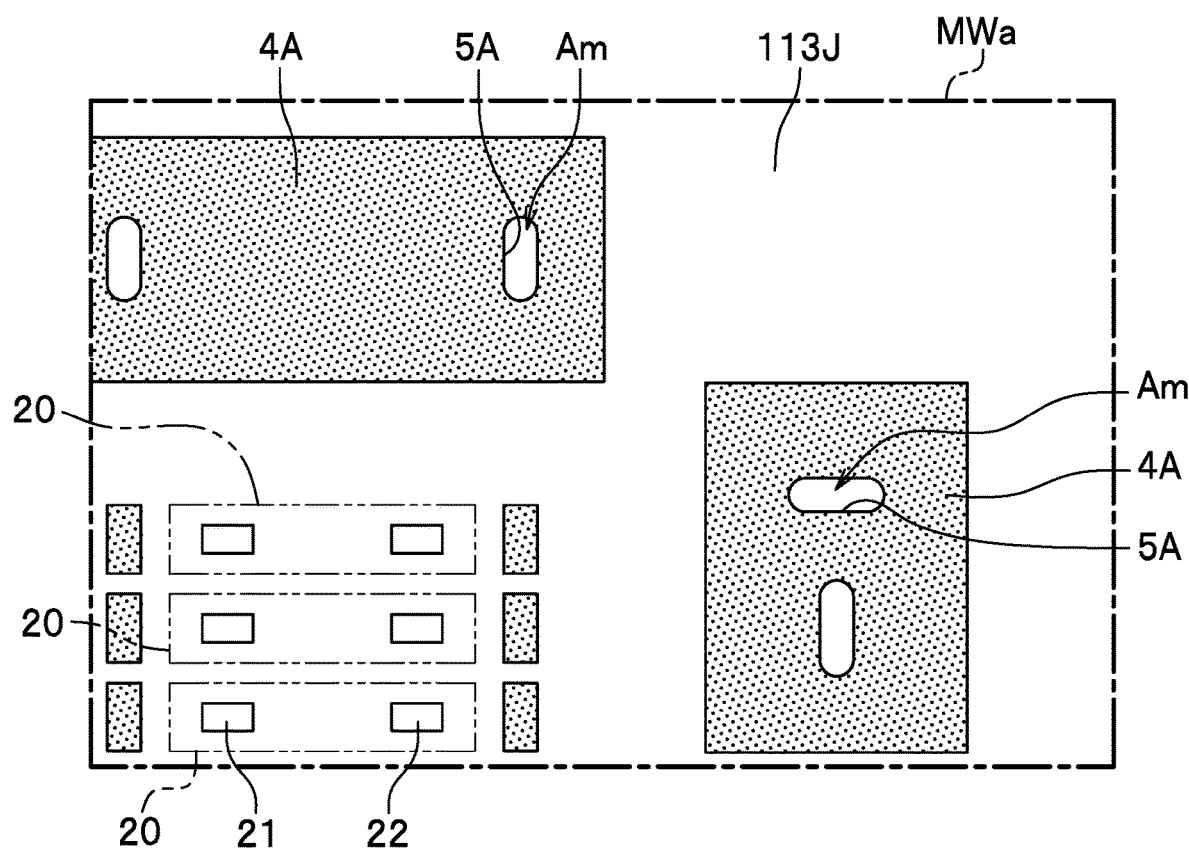
FIG. 22 is a bottom view schematically showing an enlarged view of the region MWa surrounded by the dot-and-dash line in FIG. 18 when seen from below the second lower surface of the second intermediate body with the second lower surface formed by cutting the first lower surface of the first intermediate body.
Figure 23:
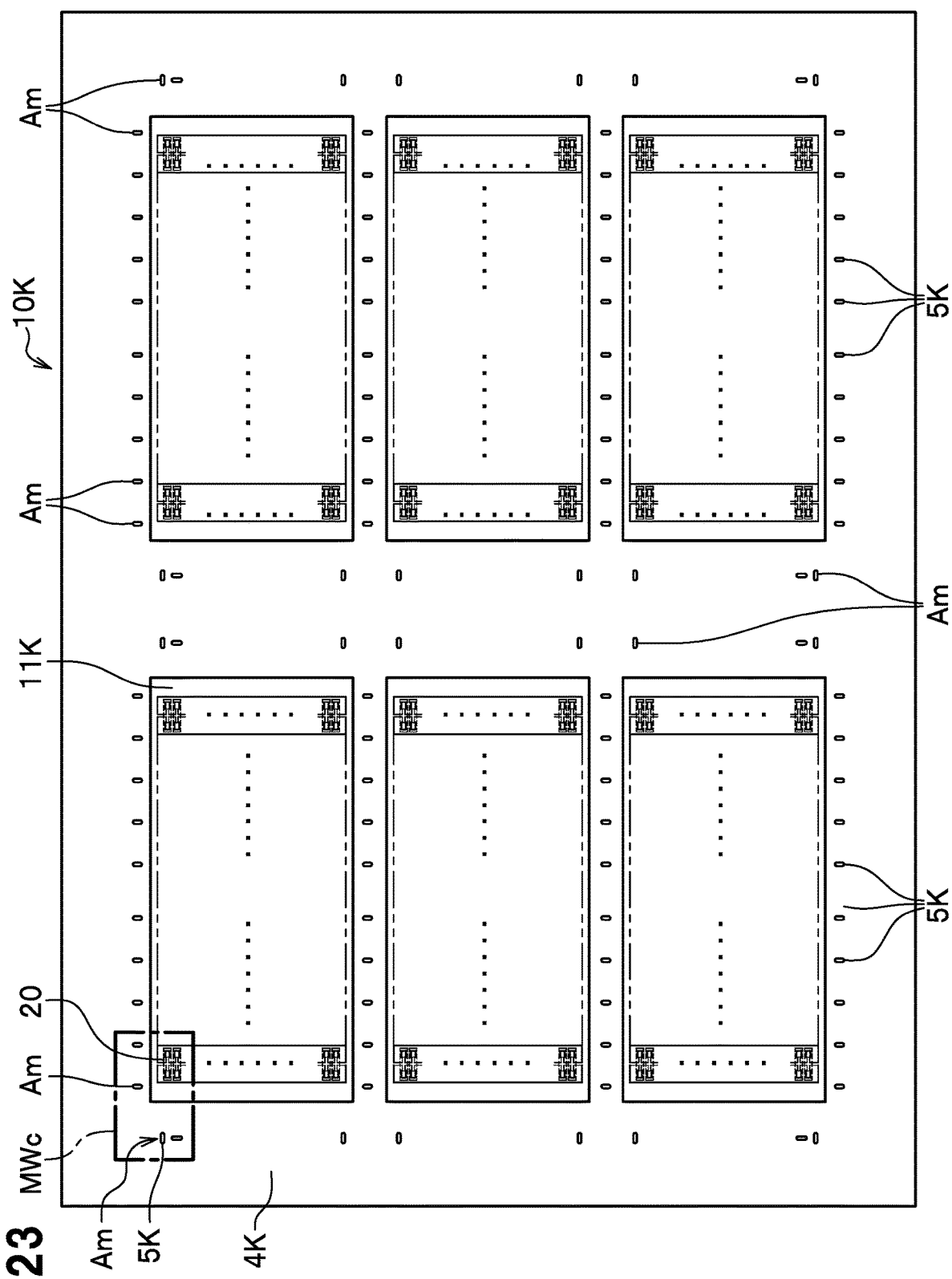
FIG. 23 is a plan view schematically showing other components of the light emitting device on the temporary substrate according to certain embodiments of the present disclosure.
Figure 24:
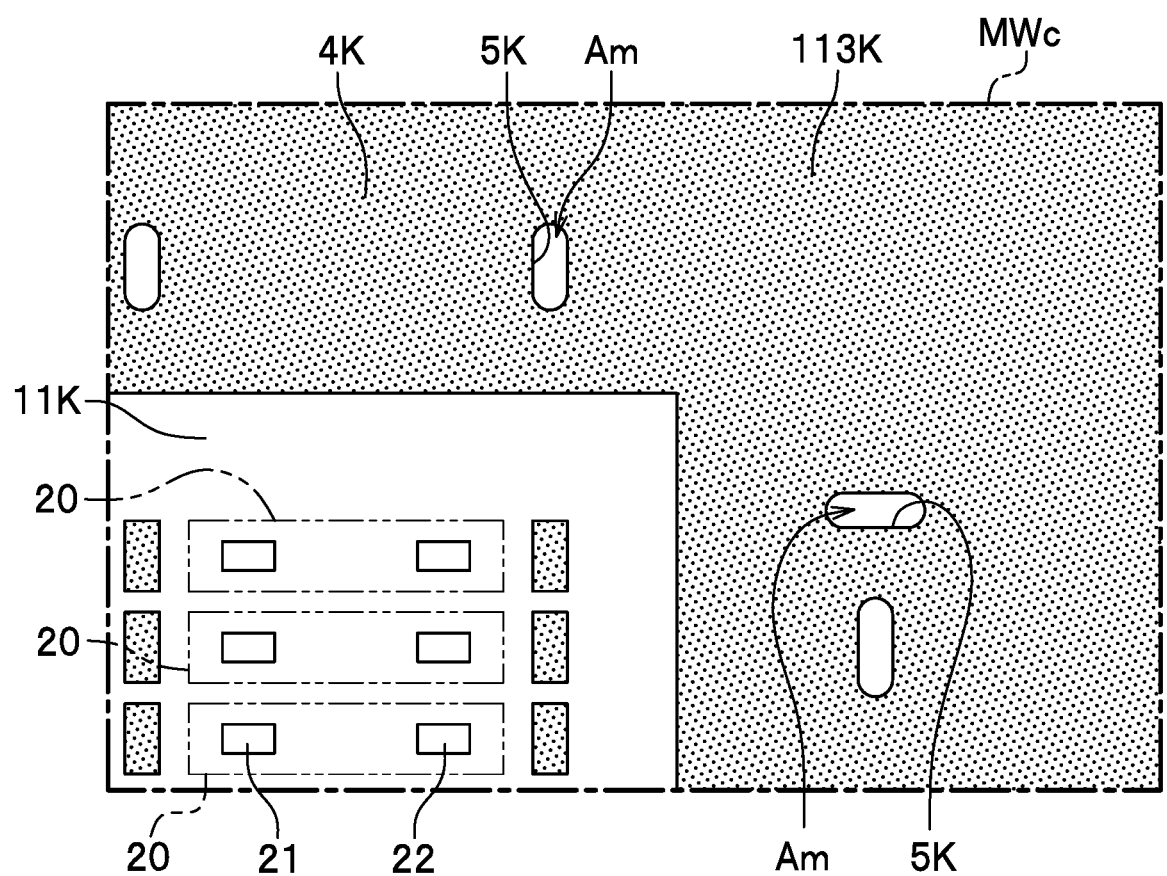
FIG. 24 is a bottom view schematically showing an enlarged view of the region MWc surrounded by a dot-and-dash line in FIG. 23 when seen from below the second lower surface of the second intermediate body with the second lower surface formed by cutting the first lower surface of the first intermediate body.

Further, in certain embodiments, it is preferable that one or more alignment marks Am, each of which serves as a mark to be used as a positioning reference in the singulating step, are formed on the temporary substrate as shown in FIGS. 18 to 24. In the step of forming the second intermediate body, at least a part of each alignment mark Am is not removed, and is present in the second intermediate body. Accordingly, the light emitting devices can be singulated with reference to the alignment mark Am during the singulating step, and therefore a variation in outer shape of the light emitting device is easily suppressed. FIG. 18 is a plan view schematically showing the temporary substrate of the light emitting device in certain embodiments. FIG. 19 is an enlarged plan view schematically showing a region MWa surrounded by a dot-and-dash line in FIG. 18. FIG. 20 is a schematic cross-sectional view taken along line XX-XX in FIG. 19. FIG. 21 is a cross-sectional view schematically showing the second intermediate body with the second lower surface formed by cutting the first lower surface of the first intermediate body. FIG. 22 is a bottom view of an enlarged form of the region MWa surrounded by the dot-and-dash line in FIG. 18 when seen from the second lower surface side for the second intermediate body with the second lower surface formed by cutting the first lower surface of the first intermediate body. FIG. 23 is a plan view schematically showing other components of the light emitting device on the temporary substrate in certain embodiments. FIG. 24 is a bottom view of an enlarged form of a region MWc surrounded by a dot-and-dash line in FIG. 23 when seen from the second lower surface side for the second intermediate body with the second lower surface formed by cutting the first lower surface of the first intermediate body.

The alignment mark Am may be formed of a part of the base, or a part of the wiring. Alternatively, the alignment mark Am may be formed of a member other than the base and the wiring. Preferably, the alignment mark Am is formed of a metal material identical to that of the first wiring. This allows for forming the alignment mark Am and the first wiring in the same step, which allows for easily reducing misalignment between the alignment mark Am and the first wiring.

As shown in FIG. 18, one or more openings 5J defined in each of metal members 4J may be used as the one or more alignment marks Am. As shown in FIG. 18, a temporary substrate 10J includes a plurality of metal members 4J provided along the outer edge of a rectangular base 11J. Each of the plurality of metal members 4J defines one or more openings 5J. In the openings 5J of the metal members 4J, the base 11J is exposed from the metal members 4J. Each opening 5J of the metal member 4J, which is an interface between the base 11J and the metal member 4J, can be used as the alignment mark Am. Preferably, the metal member 4J is formed of a metal material identical to that of the first wiring.

Preferably, a reinforcing member 14J containing a metal material is positioned on the periphery of the metal member 4J on the surface of the base as shown in FIG. 18. With the temporary substrate 10J including the reinforcing member 14J, distortion of the temporary substrate 10J can be reduced. Preferably, the temporary substrate 10J in the first intermediate body providing step includes the metal members 4J and the reinforcing member 14J on the base 11J together with the first wirings. As described with reference to FIGS. 5B to 5F, the temporary substrate 10J and each of the light emitting elements 20 are connected to each other via a respective one of the solders 60, and the first reflecting member 30 is provided, then grinding is performed from the first lower surface side to form the second lower surface 113J.

The metal member 4J may have any appropriate maximum thickness, but the maximum thickness of the metal member 4J is preferably larger than the maximum thickness of the first wiring. With such a thickness, the alignment marks Am formed in the metal member 4J are easily incorporated in the second intermediate body. Further, the maximum thickness of the metal member 4J is preferably larger than the maximum thickness of each of the element electrodes 21 and 22 of the light emitting element 20. With such a thickness, the alignment marks Am formed in the metal members 4J are easily incorporated in the second intermediate body.

In a second intermediate body 102J, the opening 5J of the metal member 4J remains even after removal of a part of the temporary substrate 10J as shown in FIGS. 21 and 22, and therefore the opening 5J can serve as an alignment mark Am. Thus, in the singulating step, operation can be performed with reference to the alignment mark Am. The metal members 4J intermittently surrounds a plurality of light emitting elements 20 in FIGS. 18 to 22, but a metal member 4K may surround the plurality of light emitting elements 20 as shown in FIGS. 23 and 24. With the metal member 4K continuously surrounding the plurality of light emitting elements 20, the strength of the second intermediate body can be increased.

On a temporary substrate 10K, the metal member 4K is formed so as to have a frame shape disposed along the outer edge of a rectangular base 11K as shown in FIGS. 23 and 24. An opening 5K having a predetermined shape is formed at a predetermined position of the metal member 4K, and used as an alignment mark Am. Similar to the metal member 4J, the metal member 4K is formed to a predetermined thickness so that the metal member 4K can remain on the second intermediate body even after removal of a part of the temporary substrate 10J. The metal member 4K and the opening 5K remain with a second lower surface 113K formed on the temporary substrate 10K, and therefore the opening 5K can be used as an alignment mark Am. Further, occurrence of distortion of the base 11K can be suppressed by the metal member 4K. The alignment mark Am in the example described above has an oval shape, but may have a shape such as a triangular shape, an oblong shape or a diamond shape as long as positioning can be performed.

The light emitting devices according to the embodiments of the present disclosure can be used for backlight devices of liquid crystal displays, various kinds of lighting fixtures, large displays, various kinds of display devices for advertisements, destination guides and the like, projector devices, and image reading apparatuses in digital video cameras, facsimile machines, copying machines, scanners and the like.

What is claimed is:

1. A method of manufacturing a light emitting device, the method comprising:
providing a first intermediate body, the first intermediate body includes:
a temporary substrate including:
a base having an upper surface and a first lower surface opposite to the upper surface, and
a pair of first wirings disposed on the upper surface of the base, and
a light emitting element disposed on the first wirings and including an electrode-formation surface and a pair of element electrodes formed on the electrode-formation surface, each of the pair of element electrodes connected to a respective one of the first wirings via a respective one of a plurality of solders;
removing a portion of the temporary substrate at a first lower surface side of the base to form a second intermediate body having a second lower surface in which a lower surface of each of the element electrodes and a lower surface of each of the solders are located; and
forming a pair of external connection electrodes on the second lower surface such that each of the pair of external connection electrodes covers a respective one of the pair of element electrodes and a respective one of the plurality of solders.

2. The method of manufacturing a light emitting device according to claim 1, further comprising, before forming the second intermediate body, forming a first reflecting member covering the electrode-formation surface of the light emitting element and lateral surfaces of the plurality of solders in the first intermediate body.

3. The method of manufacturing a light emitting device according to claim 1,
wherein the first intermediate body includes a plurality of light emitting elements, and
the method further comprises, before forming the second lower surface, forming a first reflecting member to integrally cover electrode-formation surfaces of the plurality of light emitting elements and lateral surfaces of the plurality of solders.

4. The method of manufacturing a light emitting device according to claim 2, wherein each of the pair of external connection electrodes are disposed extending from the second lower surface to cover at least a portion of corresponding lateral surfaces of the first reflecting member.

5. The method of manufacturing a light emitting device according to claim 1, wherein the portion of the first intermediate body is removed using grinding in forming the second lower surface.

6. The method of manufacturing a light emitting device according to claim 1, wherein in forming the pair of external connection electrodes on the second lower surface, the pair of external connection electrodes are formed using sputtering.

7. The method of manufacturing a light emitting device according to claim 1, wherein forming the pair of external connection electrodes on the second lower surface comprises forming a metal layer continuously covering the pair of element electrodes, and then removing a portion of the metal layer to form each of the pair of external connection electrodes.

8. The method of manufacturing a light emitting device according to claim 7, wherein in removing the portion of the metal layer, laser light is irradiated so as to remove the portion of the metal layer.

9. The method of manufacturing a light emitting device according to claim 1, wherein each of the pair of first wirings has a projection at a position facing the respective element electrode of the light emitting element, and an upper surface of the projection has a depression.

10. The method of manufacturing a light emitting device according to claim 1, wherein the second intermediate body has one or more alignment marks formed in a metal member, and the method comprises singulating into light emitting devices with reference to the alignment marks after forming the pair of external connection electrodes on the second lower surface.

11. A light emitting device comprising:
a light emitting element comprising:
a semiconductor layered body having a light extraction surface and an electrode-formation surface opposite to the light extraction surface, and
a pair of element electrodes positioned on the electrode-formation surface;
a plurality of solders each covering lateral surfaces of a respective one of the pair of element electrodes;
a first reflecting member covering the electrode-formation surface of the semiconductor layered body and lateral surfaces of the plurality of solders; and
external connection electrodes each in contact with a respective one of the pair of element electrodes, the first reflecting member, and a respective one of the plurality of solders,
wherein a lower surface of each of the pair of element electrodes, a lower surface of each of the plurality of solders and a lower surface of the first reflecting member are in the same plane.

12. The light emitting device according to claim 11, further comprising a light-transmissive member having a lower surface at a light extraction surface side of the light emitting element, the lower surface having a size larger than a size of the light extraction surface of the light emitting element.

13. The light emitting device according to claim 12, further comprising a light guiding member including a portion between a lower surface of the light-transmissive member and the light extraction surface of the light emitting element, and covering lateral surfaces of the light emitting element.

14. The light emitting device according to claim 13, further comprising a second reflecting member covering the lateral surfaces of the light emitting element such that the light guiding member is disposed between the second reflecting member and the lateral surfaces of the light emitting element.

15. The light emitting device according to claim 11, comprising a plurality of light emitting elements.

16. The light emitting device according to claim 11, wherein each of the external connection electrodes has an area larger than that of a corresponding one of the element electrodes.

17. The light emitting device according to claim 11, wherein each of the plurality of solders surrounds a respective one of the element electrodes.

18. The light emitting device according to claim 11, wherein the first reflecting member covers lateral surfaces of the light emitting element.

19. The light emitting device according to claim 11, wherein each of the plurality of solders covers the entirety of the lateral surfaces of the respective one of the pair of element electrodes.

20. The light emitting device according to claim 11, wherein each of the external connection electrodes is formed to cover at least a portion of corresponding lateral surfaces of the first reflecting member.

21. A light emitting device comprising:
- a light emitting element comprising:
  - a semiconductor layered body having a light extraction surface and an electrode-formation surface opposite to the light extraction surface, and
  - a pair of element electrodes positioned on the electrode-formation surface;
- a plurality of solders each covering lateral surfaces of a respective one of the pair of element electrodes;
- a first reflecting member covering the electrode-formation surface of the semiconductor layered body and lateral surfaces of the plurality of solders;
- external connection electrodes each in contact with a respective one of the pair of element electrodes, the first reflecting member, and a respective one of the plurality of solders,
- a light-transmissive member having a lower surface at a light extraction surface side of the light emitting element, the lower surface having a size larger than a size of the light extraction surface of the light emitting element; and
- a light guiding member including a portion between a lower surface of the light-transmissive member and the light extraction surface of the light emitting element, and covering lateral surfaces of the light emitting element.

* * * * *